(12) United States Patent
Canham et al.

(10) Patent No.: US 6,380,550 B1
(45) Date of Patent: Apr. 30, 2002

(54) ELECTROLUMINESCENT DEVICE COMPRISING POROUS SILICON

(75) Inventors: Leigh Trevor Canham; Timothy Ingram Cox; Armando Loni; Andrew John Simons; Richard Simon Blacker, all of Malvern (GB)

(73) Assignee: The Secretary of State for Defence in Her Britannic Majesty's Goverment of the United Kingdom of Great Britain and Northern Ireland, Farnborough (GB)

( * ) Notice: Subject to any disclaimer, the term of this patent is extended or adjusted under 35 U.S.C. 154(b) by 0 days.

(21) Appl. No.: 08/913,414

(22) PCT Filed: Mar. 15, 1996

(86) PCT No.: PCT/GB96/00589

§ 371 Date: Sep. 17, 1997

§ 102(e) Date: Sep. 17, 1997

(87) PCT Pub. No.: WO96/29746

PCT Pub. Date: Sep. 26, 1996

(30) Foreign Application Priority Data

Mar. 20, 1995 (GB) ............................................. 9505569

(51) Int. Cl.[7] .............................................. H01L 33/00
(52) U.S. Cl. ............................. 257/3; 257/101; 257/103
(58) Field of Search ............................ 257/3, 79, 103, 257/101, 102; 438/960

(56) References Cited

U.S. PATENT DOCUMENTS 5,348,618 A    9/1994   Canham et al. ............. 156/644

FOREIGN PATENT DOCUMENTS

EP      0 618 624 A2    10/1994
GB      2 268 333       1/1994
WO      WO A 92 19084   10/1992

OTHER PUBLICATIONS

Canham, "Silicon Quantum Wire Array Fabrication by Electrochemical and Chemical Dissolution of Wafers" *Appl. Phys. Lett.* 57 (10), Sep. 1990, pp. 1046–1048.

Badoz et al, "Physical Characterization of Silicon and Porous Silicon Based Electroluminescent Diodes" pp. 569–473 D, 1993.

Pulsford et al, "Carrier Injection and Transport in Porous Silicon Schottky Diodes" *Journal of Luminescence* 57 (1993) 181–184.

Amisola et al, "Scanning Probe Microscopy and Scanning Tunneling Spectroscopy of Porous Silicon" *Appl. Phys. Lett.* 61 (21), Nov. 1992, pp. 2595–2597.

Canham et al "Characterization of Microporous Si by Flow Calorimetry: Comparison with a Hydrophobic $SiO_2$ Molecular Sieve " J. Appl. Phys. 72 (4), Aug. 1992, pp. 1558–1565.

S. Sze, "Physics of Semiconductor Devices" 1981.

Van Buuren et al, "Photoelectron Spectroscopy Measurements of the Band Gap in Porous Silicon" *Appl. Phys. Lett.* 63 (21) Nov. 1993.

(List continued on next page.)

*Primary Examiner*—Minh Loan Tran
(74) *Attorney, Agent, or Firm*—Nixon & Vanderhye P.C.

(57) ABSTRACT

An electroluminescent device (10) comprises a porous silicon region (22) adjacent a bulk silicon region (20), together with a top electrical contact (24) of transparent indium tin oxide and a bottom electrical contact (26) of aluminum. The device includes a heavily doped region (28) to provide an ohmic contact. The porous silicon region (22) is fabricated by anodizing through an ion-implanted surface layer of the bulk silicon. The silicon remains unannealed between the ion-implantation and anodization stages. The device (10) has a rectifying p-n junction within the porous silicon region (22).

17 Claims, 13 Drawing Sheets

OTHER PUBLICATIONS

D.A.G. Bruggeman, *Ann. Phys.*, vol. 24, pp. 636–664, 1935.

Delerue et al, "Theoretical Descriptions of Porous Silicon" *Thin Solid Films* 255 (1995) 27–34.

Fizika I Tekhnika Poluprovodnikov, Nov.=Dec. 1993, Russia, vol. 27, No. 11–12, ISSN 0015–3222, pp. 1815–1819, XP000571557 Belyakov L V Et Al: "fficient electroluminescence of porous silicon" cited in the application see the whole document.

European Materials Research Society 1993 Spring Meeting 'Light Emission From Porous Silicon', vol. 57, No. 1–6, ISSN 0022–2313, Journal of Luminescence, Nov.–Dec. 1993, Netherlands, pp. 169–173, XP000573540 Lang W Et Al: "Porous silicon light–emitting p–n junction" cited in the application see the whole document.

Seventh International Conference on Solid Films and Surfaces, Hsinchu, Taiwan, Dec. 12–16, 1994, vol. 92, ISSN 0169–4332, Applied Surface Science, Feb. 1996, Elsevier, Netherlands, pp. 598–605, XP000573563 Mimura H Et Al: "Si–based optical devices using porous materials" see the whole document.

$39^{th}$ American Vacuum Society National Symposium, Chicago, IL, USA, 9–13 Nov. 1992, vol. 11, No. 4, pt.2, ISSN 0734–2101, Journal of Vacuum Science & Technology A(Vacuum, Surfaces, and Films), Jul.–Aug. 1993, USA, pp. 1736–1738, XP000403687 Kesan V P Et Al: "Electroluminescence and photoluminescence from microporous silicon p–n junctions" cited in the application see the whole document.

$7^{th}$ Internationsl Conference on Solid State Sensors and Actuators (Transducers '93), Yokohama, Japan, 7–10 Jun. 1993, vol. A43, No. 1–3, ISSN 0924–4247, Sensors and Actuators A (Physical), May 1994, Switzerland, pp. 153–156, XP000454102 Kozlowski F Et Al: Light–emitting diodes in porous silicon: cited in the application see the whole document.

Electronics Letters, Jul. 20, 1995, UK, vol. 31, No. 15, ISSN 0013–5194, pp. 1288–1289, XP000525797 Loni A Et Al: "Electroluminescent porous silicon device with an external quantum efficiency greater than 1.1% under CW operation" see p. 1289, left–hand column, line 1–line 14.

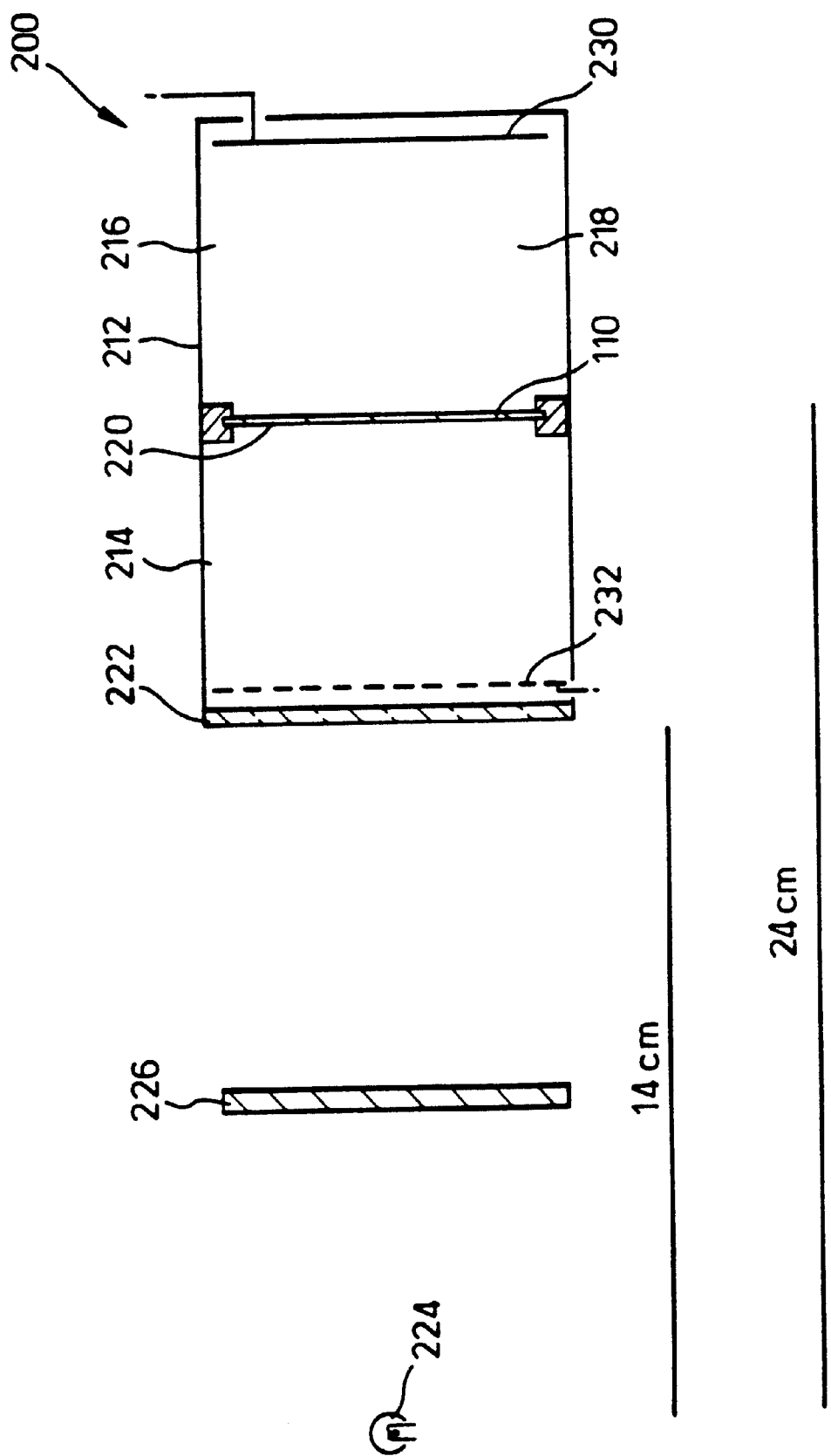

ELECTROLUMINESCENT DEVICE COMPRISING POROUS SILICON

BACKGROUND OF THE INVENTION

1. Field of the Invention

The invention concerns an electroluminescent device and more particularly an electroluminescent device fabricated from porous silicon material.

2. Discussion of Prior Art

Light emitting devices may emit light by a variety of processes. A conventional tungsten wire light bulb emits visible light when an element in the light bulb reaches a certain temperature. The emission of visible light from a substance at high temperature is termed incandescence. Luminescence is a phenomenon distinct from incandescence and is produced when electrons lose energy radiatively when moving from an excited energy state to a lower energy state which may be their ground state. Photoluminescence is luminescence from electrons which are excited into a high energy level by the absorption of photons. Photoluminescent porous silicon is described in U.S. Pat. No. 5,438,618. Electroluminescence is luminescence from electrons which are excited to higher energy levels by an electric field or an electric current. An example of electroluminescent porous silicon is described in United Kingdom Patent No. GB 2268333 B.

Light emitting diodes are an important class of electroluminescent devices. Light emitting diodes are commonly fabricated from semiconducting materials in the $Ga_{1-x}Al_xAsGa_{1-x}In_xAs_{1-y}P_y$, and $GaAs_{1-x}P_x$ systems. A measure of the efficiency of a light emitting diode is its external quantum efficiency, which is defined as the number of photons emitted by the diode divided by the number of electrons entering the diode. Devices fabricated from these materials may have external quantum efficiencies greater than 10%. Electroluminescent devices fabricated from GaAs compounds suffer from the disadvantage that they are difficult to integrate monolithically with silicon based integrated circuit technologies. It has for many years been an important objective of workers skilled in the field of semiconductor technology to be able to produce an electroluminescent device which is compatible with silicon based integrated circuit technologies.

A world-wide interest in the possible use of porous silicon as a luminescent material in an electroluminescent device was generated by a paper by L. T. Canham in Applied Physics Letters, Volume 57, Number 10, 1990, pp 1046–1048. This paper reported efficient visible photoluminescence from quantum wires in porous silicon at room temperature. A silicon quantum wire may be defined as a physically continuous column of silicon of width not greater than 10 nm, having a length which is not less than twice its width, and whose boundaries are surrounded by a suitable passivation layer. A porous silicon electroluminescent device offers the advantage of potential compatibility with conventional silicon integrated circuit fabrication techniques for use in applications such as optical displays and optoelectronic integrated circuits.

As mentioned above, electroluminescent porous silicon is described in United Kingdom Patent No. GB 2268333 B. The world-wide interest in electroluminescent porous silicon has been evidenced by a large number of published scientific papers which describe electroluminescent devices incorporating porous silicon. However, the luminescence efficiencies reported for these devices have been disappointingly low. V. P. Kesan et al. in Journal of Vacuum Science and Technology A, Volume 11, Number 4, 1993, pp 1736–1738 have reported a p-n junction porous silicon electroluminescent device having an efficiency in the range 0.04% to 0.1%. The Kesan et al. device however has a threshold current density of 30,000 $Am_{-2}$ before electroluminescence is observable. Such a high threshold value would seem to be incompatible with the stated efficiency values. Also, there is no indication in the paper of Kesan et al. as to whether the quoted efficiency measurement is an external quantum efficiency figure or some other efficiency, such as internal quantum efficiency. If the quoted efficiency figure is an internal quantum efficiency, the external quantum efficiency figure would be significantly lower, perhaps of the order of a factor 10 lower.

F. Kozlowski et al. in Sensors and Actuators A, Volume A43, No. 1–3, 1994, pp 153–156 report a light emitting device in porous silicon having a quantum efficiency of 0.01%. This paper however only provides details of the electrical characteristics of luminescent devices having quantum efficiencies in the range $10^{-3}$ to $10^{-4}\%$.

L. V. Belyakov et al. in Semiconductors, Volume 27, No. 11–12, 1993, pp 999–1001 have reported luminescence efficiencies of up to 0.3% for cathodically biased electroluminescent porous silicon devices incorporating a liquid electrolyte. They reported the observation of electroluminescence at a current density of 200 $Am^{-2}$. A device incorporating a liquid electrolyte would be difficult to integrate with a conventional silicon based microcircuit.

W. Lang et al. in Journal of Luminescence, Volume 57, 1993, pp 169–173 describe an electroluminescent device which has a thin gold top electrode. Lang et al. observed electroluminescence above a current threshold of 1.1 $Am^{-2}$ and measured an external quantum efficiency of 0.01%. They estimate that their device had an internal efficiency which was greater than 0.1%. An external efficiency value is a measure of the efficiency of generating photons external to a device and is distinct from internal efficiency values which are measures of the efficiency of generating photons within the device. The internal efficiency value will be higher than the external efficiency value because of internal absorption and scattering mechanisms.

Virtually all scientific papers published on porous silicon light emitting diodes have been concerned with device performance during operation in ambient air. An exception to this is a paper by Badoz et al. published in Proceedings 7th International Symposium on Silicon Materials Science and Technology, Electrochemical Society Inc. Pennington, N.J., Proc. Volume 94-10, pages 569–574D, 1994. They demonstrate that the stability of inefficient (external quantum efficiency $10^{-4}\%$) porous silicon light emitting diodes is dramatically improved when operated in dry nitrogen gas rather than ambient air. They suggest that degradation arises from electrically enhanced oxidation of the silicon skeleton.

Scientific papers have been published which suggest that when p-type silicon is anodized n-type porous silicon is produced. N. J. Pulsford et al. in Journal of Luminescence, Volume 57, 1993, pp 181–184 reported the anodization of 25 $\Omega$cm p-type silicon substrates to produce photoluminescent porous silicon. From measurements of the electrical characteristics of the porous silicon, they came to the conclusion that their results were consistent with the porous silicon being n-type. Amisola et al. in Applied Physics Letters, Volume 61, Number 21, 1992, pp 2595–2597 reported scanning tunnelling microscopy measurements of porous silicon produced from p-type silicon which showed that at least the surface of the porous silicon behaved like n-type material. Measurements of the spreading resistance of a layer of porous silicon having a porosity of 30% produced from heavily doped p-type silicon, using a method described in U.S. Pat. No. 5,348,618, show that the spreading resistance of the porous silicon increases with increasing depth. This corresponds to an increase in resistivity with increasing depth. This is opposite to the behaviour of porous silicon produced from heavily doped n-type silicon, and is indicative of a n-p junction being formed at the porous silicon—silicon interface. It is concluded that previously published work describing the production of electroluminescent devices by the anodization of p-n silicon structures does not result in a p-n junction being formed within the porous silicon at a position corresponding to the original p-n interface but instead results in a heterojunction between the porous silicon and the bulk silicon.

SUMMARY OF THE INVENTION

It is an object of the invention to provide an alternative electroluminescent device.

The present invention provides an electroluminescent device biasable to produce electroluminescence and comprising an electroluminescent porous silicon region and electrical connections to the porous silicon region, characterized in that electroluminescence from the porous silicon region is detectable when the device is biased such that a current having a current density of less than 1.0 $Am^{-2}$ flows through the device.

The invention provides the advantage that a low threshold current is required to produce electroluminescence. A low threshold current is advantageous in applications where power conservation is at a premium, for example battery powered electronics.

The devices of the present invention may be fabricated by a method which includes anodizing a silicon wafer after it has received a dopant implant but without the wafer being annealed after the implantation. In general, silicon wafers are annealed after they have received a dopant implantation in order to activate electrically the dopant species and to anneal any damage to the crystal structure caused by the implantation process. Anodizing a wafer after a dopant implantation with no intervening anneal stage would be considered surprising to those familiar with silicon processing techniques.

The device may exhibit electroluminescence when biased such that an electrical current having a current density of less than 0.1 $Am^{-2}$ flows through the device. Electroluminescence from the device may be visible to an unaided human eye when the current density is less than 0.1 $Am^{-2}$. Electroluminescence may be detectable when the current density is less than 0.01 $Am^{-2}$ and as low as 0.0001 $Am^{-2}$. The external quantum efficiency of the electroluminescence may be greater than 0.1%. External quantum efficiencies as high as 0.4% have been measured for devices operating at 200 K (−73° C.). The combination of high efficiency and low threshold current are particularly advantageous. A device of area 1 $mm^2$ operating under an applied bias current density of 0.0001 $Am^{-2}$ would require a bias current of only $10^{-10}$ amps, or 0.1 nA, to produce detectable luminescence.

In another aspect, the invention provides a solid state electroluminescent device comprising an electroluminescent porous silicon region and electrical connections to the porous silicon region, characterized in that the device is biasable to produce electroluminescence from the porous silicon region with an external quantum efficiency greater than 0.01%.

A high external quantum efficiency is advantageous since for a given luminescent intensity, the more efficient a device, the less power it requires.

The solid state device of the invention may exhibit electroluminescence with an external quantum efficiency greater than 0.1%. The external quantum efficiency may be in the range 0.01% to 0.18% and may be at least 0.4%.

The solid state device of the invention may comprise a p-type porous silicon region and an n-type porous silicon region with a p-n junction therebetween. As stated previously, there are indications that conventionally produced porous silicon is n-type even if the starting material was p-type silicon. It therefore follows that previous electroluminescent porous silicon devices which allegedly contained a p-n junction within porous silicon may have had some other form of junction either between a top contact and the porous silicon or at the interface between the porous silicon and the unanodized bulk silicon.

At least one of the p-type and n-type porous silicon regions may be surface doped. Surface doped porous silicon is porous silicon which has been doped by dopant species deposited on the surfaces of the silicon structures forming the porous silicon. These dopant species may either remain at the surface or diffuse into the silicon. The p-type porous silicon may be surface doped, and the surface dopant may be boron. The device may electroluminesce with an external quantum efficiency greater than 0.1%.

The device of the invention may incorporate an injector layer for injecting holes into a luminescent region of the porous silicon. This injector layer may be a surface layer of porous silicon. It has been found that the surface region of the porous silicon may have raised levels of oxygen, carbon, and fluorine and so may have a wider band gap than the luminescent region of porous silicon and so would act as an efficient hole injector.

Preferably the device of the invention is produced by light assisted anodization in aqueous hydrofluoric acid. It is known that light assisted anodization in ethanoic hydrofluoric acid generally results in mesoporous porous silicon. Mesoporous porous silicon has pore sizes greater than 20 Å wide and less than 500 Å wide. It is known that light assisted anodization of an $n^-$ silicon substrate may also generate some degree of macroporosity. Macroporous porous silicon has pore sizes greater than 500 Å wide. The anodization conditions of the device of the invention avoid the creation of both macroporous and mesoporous porous silicon. The active portion of the device is microporous with pore sizes less than 20 Å wide.

The electroluminescent device may comprise an n-type bulk silicon region, an n-type porous silicon region adjacent the n-type bulk silicon region, a p-type porous silicon region adjacent the n-type porous silicon region, and electrical contacts to the bulk silicon region and the p-type porous silicon region.

The device of the invention may be operable to produce a modulated light output. The light output may be modulatable at a frequency greater than 10 kHz. Modulation of the optical output of the device has been observed at modulation frequencies up to 1 MHz. The device of the invention may have an electroluminescence intensity maximum at a wavelength which is greater than 400 nm and less than 900 nm. The intensity maximum may be at a wavelength in the range 520 nm to 750 nm.

The device of the invention may be an encapsulated device, whereby the porous silicon is protected from the environment since the operating efficiency of an unencapsulated device may degrade upon exposure to water vapour and/or oxygen. The encapsulation may be provided by a vacuum chamber or some other form of encapsulation arrangement such as an impermeable top contact to the porous silicon which may be of indium tin oxide.

The device may be integrated with other silicon devices as part of an opto-electronic integrated circuit. The electroluminescent device of the invention may be combined with further devices of the invention to form a display which may produce a light output having a plurality of colours.

In another aspect, the invention provides a method of fabricating an electroluminescent device including the steps of:
 (i) implanting a surface region of a silicon wafer, doped with a donor impurity to render the wafer n-type, with an acceptor impurity such that the surface region has a volume concentration of the acceptor impurity which is greater than a volume concentration of the donor impurity;
 (ii) anodizing the wafer under illumination to produce a luminescent porous silicon region extending through the surface region; and
 (iii) depositing an electrode on the porous silicon region; characterized in that the surface region has a sheet resistivity greater than 100 $\Omega^{-1}$ immediately prior to the anodizing step.

In a further aspect, the invention provides a method of fabricating an electroluminescent device including the steps of:
 (i) implanting a surface region of a silicon wafer, doped with a donor impurity to render the wafer n-type, with an acceptor impurity such that the surface region has a volume concentration of the acceptor impurity which is greater than a volume concentration of the donor impurity;
 (ii) anodizing the wafer under illumination to produce a luminescent porous silicon region extending through the surface region; and
 (iii) depositing an electrode on the porous silicon region; characterized in that less than 1% of the acceptor impurity is electrically active prior to the anodizing step.

In a further aspect, the invention provides a method of fabricating an electroluminescent device including the steps of:
 (i) implanting a surface region of a silicon wafer, doped with a donor impurity to render the wafer n-type, with an acceptor impurity such that the surface region has a volume concentration of the acceptor impurity which is greater than a volume concentration of the donor impurity and at least a part of the region has an acceptor impurity volume concentration comparable with the solid solubility limit of the acceptor impurity in silicon;
 (ii) anodizing the wafer under illumination to produce a porous silicon region extending through the surface region; and
 (iii) depositing an electrode on the porous silicon region.

In a further aspect, the invention provides a method of fabricating an electroluminescent device including the steps of:
 (i) implanting a surface region of a silicon wafer, doped with a donor impurity to render the wafer n-type, with an acceptor impurity such that the surface region has a volume concentration of the acceptor impurity which is greater than a volume concentration of the donor impurity;
 (ii) anodizing the wafer under illumination to produce a luminescent porous silicon region extending through the surface region; and
 (iii) depositing an electrode on the porous silicon region; characterized in that the silicon wafer does not receive an anneal between steps (i) and (ii).

In a further aspect, the invention provides a method of fabricating an electroluminescent device including the steps of:
 (i) implanting a surface region of a silicon wafer, doped with a donor impurity to render the wafer n-type, with an acceptor impurity such that the surface region has a volume concentration of the acceptor impurity which is greater than a volume concentration of the donor impurity;
 (ii) anodizing the wafer under illumination to produce a luminescent porous silicon region extending through the surface region; and
 (iii) depositing an electrode on the porous silicon region; characterized in that the anodization step causes surface doping of silicon quantum wires within the porous silicon region, rendering the surface doped quantum wires p-type.

In a yet further aspect, the invention provides p-type porous silicon, characterized in that the porous silicon has a porosity greater than 30%. The porosity may be greater than 60% and the porous silicon may comprise quantum wires.

The invention further provides substantially wholly microporous visibly luminescent porous silicon, characterized in that the porous silicon is derived from n-type bulk silicon.

In another further aspect, the invention provides an electroluminescent device comprising a porous silicon region and electrical connections to the porous silicon region, characterized in that the porous silicon region contains a p-n junction therein.

The invention further provides an electroluminescent device comprising a porous silicon region and electrical connections to the porous silicon region, characterized in that the porous silicon region is a wholly microporous visibly luminescent region fabricated from n-type bulk silicon.

BRIEF DESCRIPTION OF THE DRAWINGS

In order that the invention may be more fully understood, embodiments thereof will now be described, by way of example only, with reference to the accompanying drawings, in which:

FIG. 4 schematically illustrates anodization equipment for anodizing the implanted wafer;

DETAILED DISCUSSION OF PREFERRED EMBODIMENTS

Figure 1:
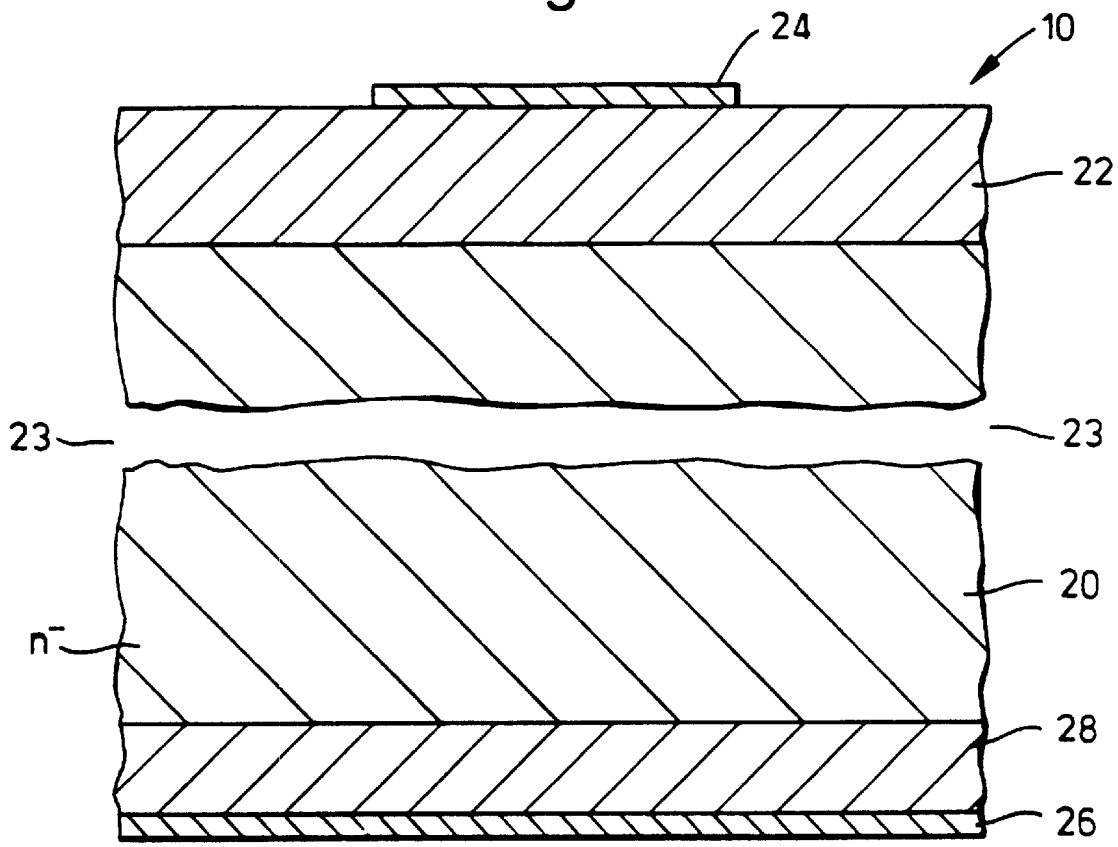
FIG. 1 illustrates schematically a vertical cross-section through an electroluminescent device of the invention.

Referring to FIG. 1 there is shown an electroluminescent device 10. The device 10 comprises a silicon substrate 20 surmounted by a luminescent porous silicon region 22. FIG. 1 is not drawn to scale, as indicated by discontinuities 23. The device 10 includes a top electrode 24 of transparent indium tin oxide and a bottom electrode 26 of aluminium. The silicon substrate 20 includes a heavily doped region 28 for forming an ohmic contact with the bottom electrode 26. The porous silicon region 22 has a mean thickness of 0.4 $\mu$m, the top electrode 24 has a thickness of 0.1 $\mu$m and the bottom electrode has a thickness of 0.5 $\mu$m. When a dc electrical current is passed between the two electrodes 26 and 24, the device 10 luminesces at a peak wavelength in a range 520–750 nm with a full width at half maximum of between 60 and 150 nm.

The device 10 is fabricated as follows. In a first step, the heavily doped ohmic contact region 28 is formed. The formation of a heavily doped region to form an ohmic contact is a standard silicon integrated circuit process. A back face of a 75 mm diameter wafer of lightly doped n-type, denoted n⁻, (100) silicon of resistivity in the range 10–20 $\Omega$cm is implanted by ion implantation at an energy of 70 keV in a Varian 350 RD ion beam implanter with a donor, impurity. The donor impurity is phosphorous which is implanted at a dose of $5 \times 10^{15}$ cm$^{-2}$. Following the ion implantation, the implanted wafer is cleaned by washing the wafer in two chemical baths. The wafer is immersed in a first bath containing 300 ml of 35% $NH_3$ solution, 300 ml of 30% $H_2O_2$ solution and 1500 ml of deionized water at a temperature of 88° C. for 15 minutes and then immersed in a second bath containing 300 ml of 35% HCl solution, 300 ml of 30% $H_2O_2$ solution and 1500 ml of deionized water at a temperature of 88° C. for 10 minutes. After immersion in the two baths, the wafer is rinsed in de-ionised water and dried. After cleaning, the implanted wafer is annealed in argon-2% oxygen at 1050° C. for 30 minutes which results in the formation of a thin surface oxide layer on each face of the wafer having a thickness of approximately 60 Å.

In a second step a front face of the silicon wafer is implanted with an acceptor impurity. The acceptor impurity dopant is boron. The boron is implanted in a Varian 350 RD ion beam implanter with an ion beam of energy 35 keV and a beam current of 250 $\mu$A and a beam size of approximately 0.2×1.0 mm². The ion beam is scanned over the front face of the silicon wafer in a complex scan pattern which ensures uniform dosing of the surface. Each scan takes approximately 1 second. The wafer receives an implantation having a total implantation time of 10 minutes during which the wafer receives a total dose of $1 \times 10^{16}$ cm$^{-2}$. During the implantation, the wafer is held on a thermal sink which prevents the temperature of the silicon rising excessively due to the implantation. The temperature of the wafer rises to no more than 120° C. during the second ion implantation step and it is estimated that the temperature of the wafer rises to between 30° and 40° C.

In conventional integrated circuit processing, a silicon wafer would be annealed after ion implantation to recrystallise and then anneal out any point defects introduced during the ion implantation and to activate electrically the dopant. Electrical activation of the boron dopant occurs when the dopant atoms occupy substitutional sites within the silicon lattice. However, in the present fabrication process, the wafer is not annealed after ion implantation. This lack of an anneal after the ion implantation process would be considered undesirable and surprising to those skilled in the field of silicon integrated circuit processing since the dopant has low electrical activity and the silicon remains in a damaged state.

Measurements of the sheet resistivities of the heavily doped region 28 after annealing and of the front face after ion implantation have been made. The region 28 had a sheet resistivity of 16$\Omega^{-1}$, which compares with an estimated value for a fully activated dopant implant of 10$\Omega^{-1}$. Therefore within experimental error, the dopant in the heavily doped region 28 is fully activated. After ion implantation, the front face had a sheet resistivity of 1800$\Omega^{-1}$, compared with an estimated value of 10$\Omega^{-1}$ if the dopant had been fully activated. The conductivity of the unannealed implanted boron layer is less than 1% the expected conductivity if the dopant had been fully electrically activated. Transmission electron microscopy has indicated that the crystalline structure of the implanted silicon is heavily damaged by the boron ion implantation.

Figure 3:
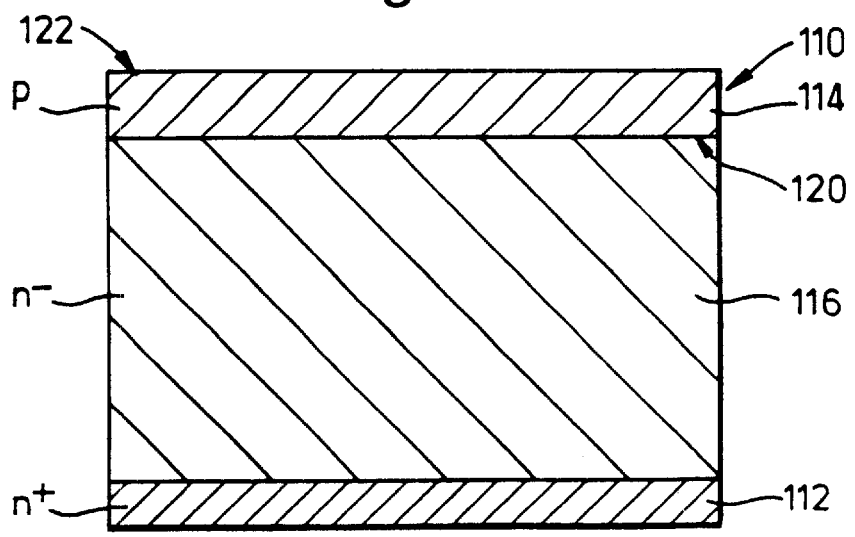
FIG. 3 is a schematic illustration of a cross-section of the silicon wafer after the boron implantation.
Figure 2:
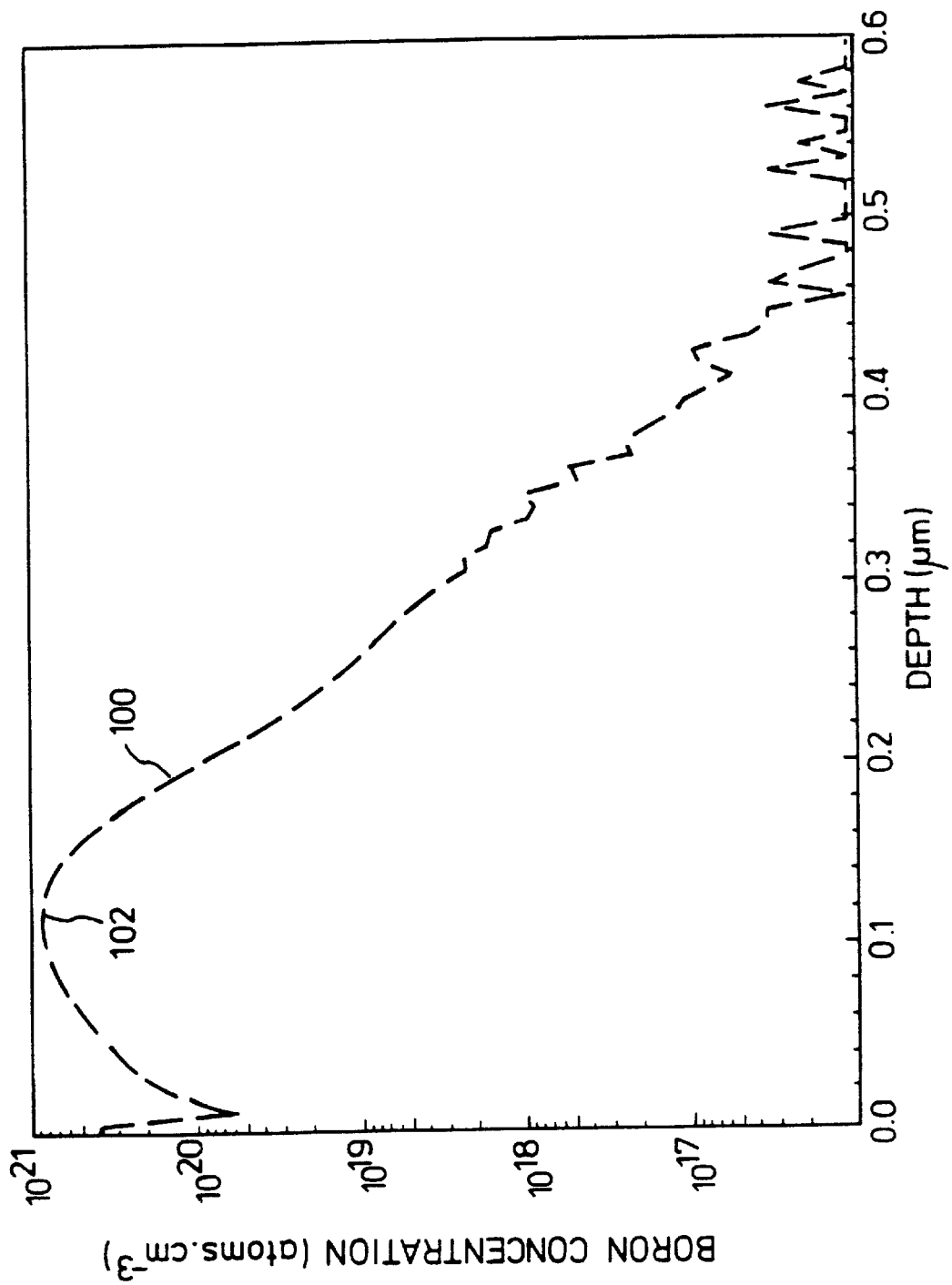
FIG. 2 graphically illustrates a plot of boron dopant concentration in a silicon wafer after ion implantation as determined by secondary ion mass spectrometry.

The ion implanted silicon wafer has been measured using secondary ion mass spectroscopy (SIMS) to determine a distribution of boron within the silicon. FIG. 2 shows a plot 100 of dopant concentration in atoms cm$^{-3}$ against depth from the front face in mm. The SIMS measurements indicate a peak in dopant concentration 102 of $8 \times 10^{20}$ atoms cm$^{-3}$ a distance of 120 nm below the front surface. Boron has a maximum solid solubility in silicon of approximately $5 \times 10^{20}$ atoms cm$^{-3}$ at 1200° C. The peak dopant concentration 102 is thus comparable with the solid solubility limit of boron in silicon. The implanted silicon has a damaged region which is associated with the implanted boron. It is expected that the damaged region has a peak in damage which is slightly deeper than the peak in dopant concentration 102. FIG. 3 shows a schematic representation of a silicon wafer 110 after the second ion implantation process.

The wafer 110 has a first region 112 which is heavily doped with an n-type dopant, denoted n⁺. A second region 114 is doped so as to be a p-type region. A remaining region 116 has the n⁻ doping of the original wafer. Since the dopant in the region 114 is not fully electrically active a position for an interface 120 between the p-type region 114 and the n region 116 is difficult to determine. The interface 120 is less than 600 nm from a front surface 122.

Following the second ion implantation step, the porous silicon region 22 is produced by a light assisted anodization process. Anodization in the context of the production of porous silicon is a generally accepted term for electrolytic selective dissolution of silicon. Referring to FIG. 4 there is shown in schematic form anodizing equipment 200 for the production of the porous silicon region 22. In the equipment 200, the silicon wafer 110 is held within an anodizing cell 212. The anodizing cell 212 is of PTFE. The silicon wafer 110 divides the cell into two electrolyte baths 214 and 216. The electrolyte baths 214 and 216 each contain an electrolyte 218 comprising a solution of 40 wt % HF in water (electronic grade). The electrolyte 218 in each bath is pumped around a respective closed loop (not shown) to provide circulation of the electrolyte.

The anodization process is light-assisted. In order to illuminate a first face 220 of the wafer 110, the anodizing cell 212 has a polycarbonate window 222 and an 800 W tungsten-halogen lamp 224 is positioned 24 cm from the face 220 and 14 cm from the polycarbonate window 222. A water cooled infrared absorbing filter 226 is placed between the lamp 224 and the window 222. The first face 220 corresponds to the front face of the silicon wafer implanted with p-type dopant. Measurements of the light intensity at the window 222 were made using a calibrated silicon photodiode detector system comprising a Newport model 840-C meter together with an 818-ST detector. The meter gave a reading of 130 mWcm⁻² with a detector control unit set at a wavelength compensation of 900 nm.

Each of the baths 214 and 216 contains a respective platinum electrode 230 and 232. The electrode 232 is in the form of a gauze in order to allow the transmission of light through it. In operation, the electrode 232 is biased negatively, forming a cathode and the electrode 230 is biased positively to form an anode. A constant current source is connected between the anode and the cathode. In operation, an anodizing current with an anodizing current density of 3 mAcm⁻² at the silicon wafer face 220 is passed between the electrodes. The electrolyte is maintained at a temperature of between 16° and 17° C. The silicon wafer is anodized for 4 minutes. In the anodization process, a porous silicon region is created which extends through the p-type region 114 into the n-type region 116.

The anodized silicon wafer is left in the HF containing electrolyte 218 for a further one minute after the anodization is completed and the anodizing current switched off but still under illumination. The wafer is removed from the electrolyte and the wet wafer is then dried by spinning in air at a speed of 2500 rpm for a duration of thirty seconds. The spinning process is repeated six times. Under these fabrication conditions, no evidence of macroporous (pores greater than 50 nm in diameter) silicon has been observed using scanning electron microscopy.

The thickness of the porous silicon region after drying has been measured by viewing a cross section of the silicon wafer in a SEM and also by chemically stripping part of the porous silicon region from the silicon wafer using a NaOH solution and measuring a resulting step height between the stripped region and the unstripped region using a scanning probe height measuring instrument. The thickness of the porous silicon region 22 was measured to be 0.4 $\mu$m±0.1 $\mu$m across the wafer. The average porosity of the porous silicon region was measured using gravimetric techniques to be 70%±5%.

Following creation of the porous silicon region 22, a piece of wafer having a size of 20 mm by 15 mm is cleaved from the centre of the silicon wafer. The top and bottom electrodes 24 and 26 are then deposited onto this piece of wafer. The top electrode 24 is deposited onto the porous silicon region 22 by rf magnetron sputtering using a two inch sputter target comprising a hot pressed and calcined mixture of 90% $In_2O_3$ and 10% $SnO_2$ available from CERAC Limited. The sputtering was performed at room temperature using an rf frequency of 13.56 MHz and a sputtering power of 50 watts in a flowing sputtering gas of 0.09% oxygen in argon at a pressure of $8 \times 10^{-3}$ mbar with the silicon wafer being 6 cm from the target. A film of indium tin oxide (ITO) is deposited through a shadow mask to form dots of diameter between 1 and 2 mm and a thickness of 0.1 $\mu$m over a deposition period of 15 minutes, during which the piece of wafer warms to a temperature of approximately 60° C. It may be possible to deposit ITO of the required characteristics in a sputtering gas having an oxygen content in the range 0.01% to 0.3% with the balance being argon, in a pressure range of $2 \times 10^{-3}$ to $1.6 \times 10^{-2}$ mbar, with a target wafer separation in the range 1 to 15 cm.

The deposited ITO film has a typical optical transmission coefficient of 85% for light of wavelength in the range 400–900 nm and has a permeability which is dependent on its thickness. The ITO film has been measured to determine its characteristics using Hall measurements and has been found to be n-type with an electrical resistivity of 1.6 m$\Omega$cm. FTIR absorption measurements through the ITO contact show that the silicon-hydrogen bonds present in the as anodised material are still present after ITO deposition. In addition there is no evidence for significant oxidation of the structure during ITO deposition. The ITO layer may be permeable depending on its thickness. Chemography measurements of samples with a 0.1 $\mu$m thick ITO layer have indicated that the ITO is permeable whereas samples with a 0.2 $\mu$m thick layer showed significantly less permeability. This technique is described by L. T. Canham et al. in Advanced Materials, Volume 6 Number 11, 1994, pages 865–868. In the chemography measurements, a piece of unexposed photographic film is placed in contact with the sample in the dark for a period of time and then developed. When porous silicon is placed in contact with the photographic film, silane produced by a reaction between the porous silicon and moisture in the air reacts with the photosensitive chemicals on the photographic film so that after development a dark "image" is formed. The production of an image with the ITO covered samples indicates that the ITO is permeable and at least silane is passing through the ITO, probably together with water vapour in the opposite direction.

The bottom electrode 26 is deposited onto the bottom of the piece of wafer using a thermal evaporation process. The aluminium is evaporated in a vacuum of approximately 10⁻⁶ mbar to a thickness of 0.5 $\mu$m. In conventional integrated circuit manufacture, an evaporated ohmic contact would be annealed in forming gas, a mixture of nitrogen and hydrogen, at 425°–450° C. This annealing procedure is not carried out in the creation of an ohmic contact to the device 10. The deposition of a bottom electrode is not a critical step in the manufacture of a porous silicon electroluminescent device. A device may be made to luminesce with direct electrical contact to the heavily doped region 28.

Figure 5:
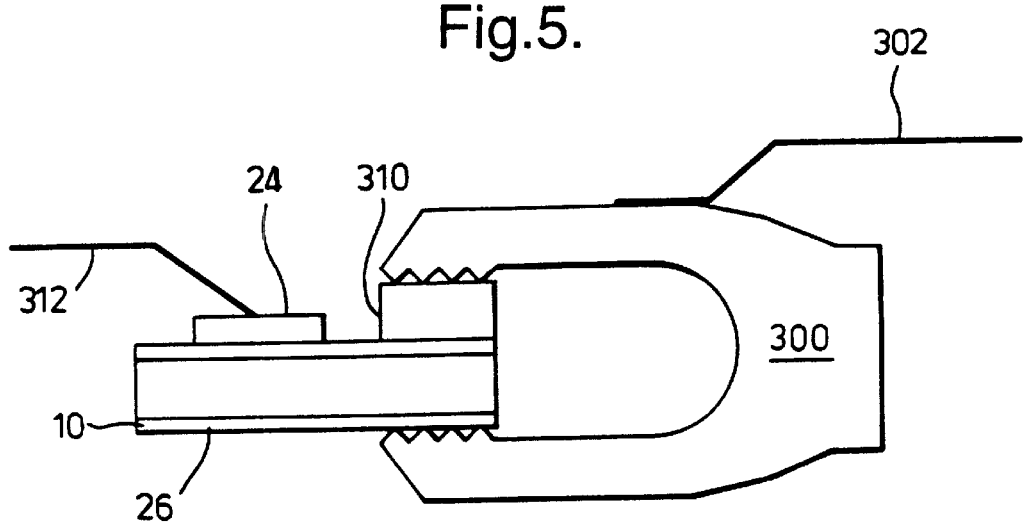
FIG. 5 shows the FIG. 1 device after electrical contact has been made to the device.

In order to obtain luminescence from the device 10, electrical contact is made to the top and bottom electrodes 24 and 26. Referring to FIG. 5 there is shown a device 10 to which electrical contact has been made to the top and bottom electrodes 24 and 26. Electrical contact to the bottom electrode 26 is made by a metal crocodile clip 300 to which a wire 302 has been attached. A piece of mica 310 is placed between the clip 300 and the porous silicon region, 22 to protect the porous silicon and to provide electrical insulation between the clip 300 and the porous silicon region 22. Electrical contact to the top electrode 24 is made by a sprung gold wire probe 312 of diameter 30 mm. The wire 302 and the probe 312 are connected to a computer controlled power supply (not shown).

Figure 6C:
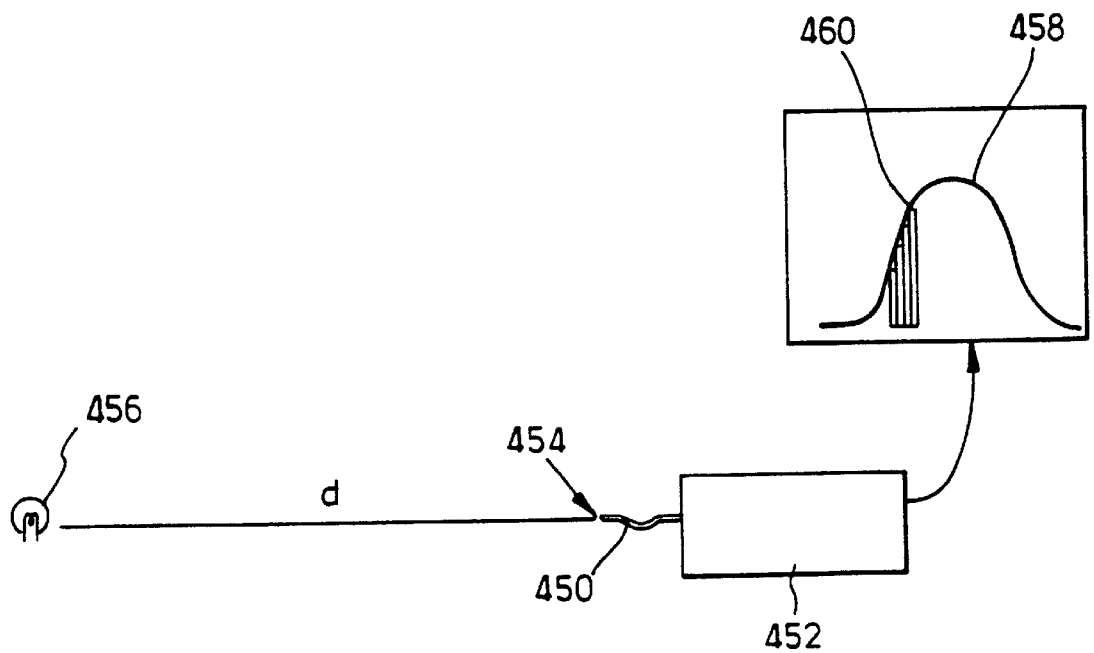
FIG. 6c shows schematically an arrangement for calibrating the FIG. 6b equipment.
Figure 6A:
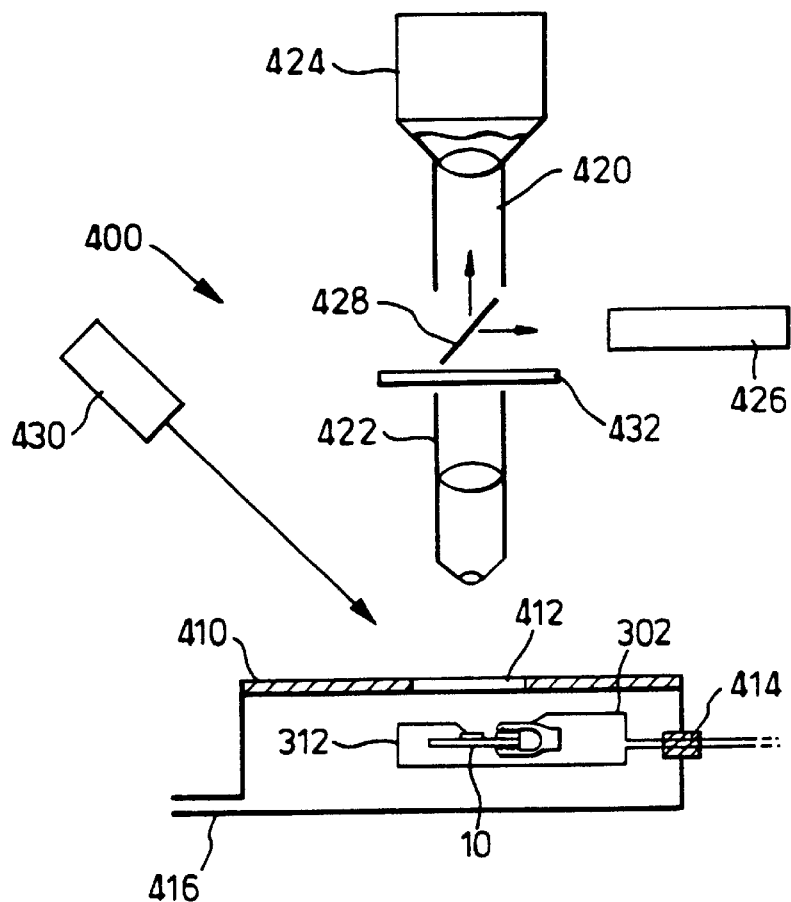
FIG. 6a shows light output measurement equipment.

Referring to FIG. 6*a* there is shown equipment 400 for the measurement of light output from the device 10 as a function of current through the device and applied voltage. Measurements of light output are generally made at room temperature but measurements can also be made at elevated and reduced temperatures. The device 10 is placed inside a vacuum chamber 410 having a glass window 412. Electrical contact to the probe 312 and the wire 302 is made through a feedthrough 414. The chamber 410 is evacuated through a port 416 connected to a rotary pump (not shown) to an approximate pressure of 0.05 mbar as measured by a calibrated capacitance manometer. An imaging system 420 comprising a microscope 422 to which a CCD camera 424 and a photomultiplier 426 is connected is used to observe the emission of light from the device 10. The photomultiplier 426 may be replaced by an optical multichannel analyser (not shown). A beam splitter 428 in the microscope 422 splits received light between the camera 424 and the photomultiplier 426. A beam of blue light of wavelength 442 nm from a laser 430 may be directed onto the device 10 for photoluminescence measurements. During photoluminescence measurements, a cut-off filter 432 is inserted into the microscope 422 in order to filter out blue light from the laser 430.

Figure 6B:
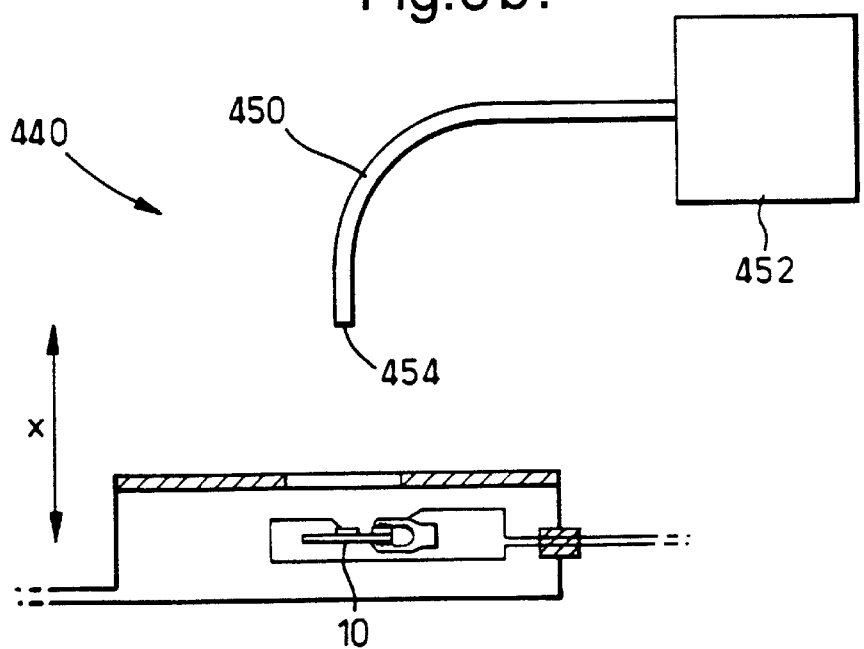
FIG. 6b shows light output measurement equipment for measuring an output efficiency of the FIG. 1 device.

In order to obtain measurements of the output efficiency of the device 10, the imaging system 420 is replaced by a detection system 440, as shown in FIG. 6*b*. The detection system 440 comprises an optical fibre 450 which receives light from the device 10 and guides it to a spectrometer 452. An input face 454 of the optical fibre 450 is positioned at a distance x from the device 10 and at a normal incidence to the centre of the device.

The combination of the optical fibre 450 and the spectrometer 452 was calibrated for sensitivity as a function of wavelength using an arrangement shown in FIG. 6*c*. The input face 454 is positioned at a distance d, approximately three metres, from a calibrated tungsten light source 456 and a spectrum 458 is recorded. The spectrometer 452 includes a diode array detector of a multichannel type in which each separate channel corresponds to a given wavelength range from $\lambda_n - \Delta\lambda/2$ to $\lambda_n + \Delta\lambda/2$. For example, a channel 460 corresponds to a range 620 to 620.6 nm. The central wavelength, $\lambda_n$, of channel n is determined by measuring the channel number of the peak of a series of known spectral features such as laser lines. The recorded spectrum 458 is a measure of intensity as a function of wavelength, $I^N(n,\lambda_n)$, where $I^N(n,\lambda_n)$ denotes the number of counts per second in channel n, covering the wavelength range from $\lambda_n - \Delta\lambda/2$ to $\lambda_n + \Delta\lambda/2$. The superscript N denotes that the measured signal is in counts per second.

The light output from the light source 456 was previously calibrated to obtain a measure of the output as a function of wavelength, $L(\lambda)$, in units of watts $m^{-2}$ $nm^{-1}$ for a distance of 0.5 m from the source. The output at a distance d, $L^d(\lambda)$, is obtained by multiplying $L(\lambda)$ by $(0.5/d)^2$, where d is in metres.

The measured signal in channel n corresponds to a power density at the input face 454 of $L^d(\lambda).\Delta\lambda$ having units of watts $m^{-2}$. The power sensitivity of channel n, $S^P(n,\lambda_n)$, is given by $$S^P(n,\lambda_n) = (L^d(\lambda_n).\Delta\lambda)/I^N(n,\lambda_n),$$

where $\Delta\lambda$ is the spectral width of each channel of the detector in nm. $S^P(n,\lambda_n)$ is in units of watts $m^{-2}$/(counts per second).

The sensitivity of channel n of the detection system 440 in terms of photon flux density, $S^Q(n,\lambda_n)$, is given by $$S^Q(n,\lambda_n) = (L^d(n,\lambda_n).\Delta\lambda/E_P^{\lambda n})/I^N(n,\lambda_n).$$

where $E_P^{\lambda n}$ is the energy of a photon of wavelength $\lambda_n$ and is given by $$E_P^{\lambda n} = h.c/\lambda_n,$$

where h is Planck's constant and c is the velocity of light. The units of $S^Q(n,\lambda_n)$ are photons $sec^{-1} m^{-2}$/(counts per second).

From measurements of the light output by the device 10 at a distance x an intensity spectrum, $I^N_D(n,I_n)$, is obtained in counts per second. The number of photons output at position x per $m^2$ per second, $Q_x$, is given by $$Q_x = \Sigma^n I^N_D(n,\lambda_n).S^Q(n,\lambda_n),$$

where the summation is over n, the number of channels of the detector.

The dependence of the output of the device 10 as a function of angle has been measured up to angles of ±45°. It was found that in this angular range, the intensity of the output was Lambertian, i.e. proportional to $Cos(\theta)$, where $\theta$ is the angle to the device normal. It is assumed that the output is also Lambertian for the angles 45°<θ<90°.

The total number of photons output per second from a Lambertian source. $Q_{tot}$, is given by $$Q_{tot} = Q_x.\pi.x^2.$$

The output external quantum efficiency, EQE, in per cent representing the percentage of photons emitted from the device per electron injected is given by $$EQE = (100.Q_{tot}).q/I,$$

where q is the charge per electron and the current through the device, I, is in amps.

Figure 7:
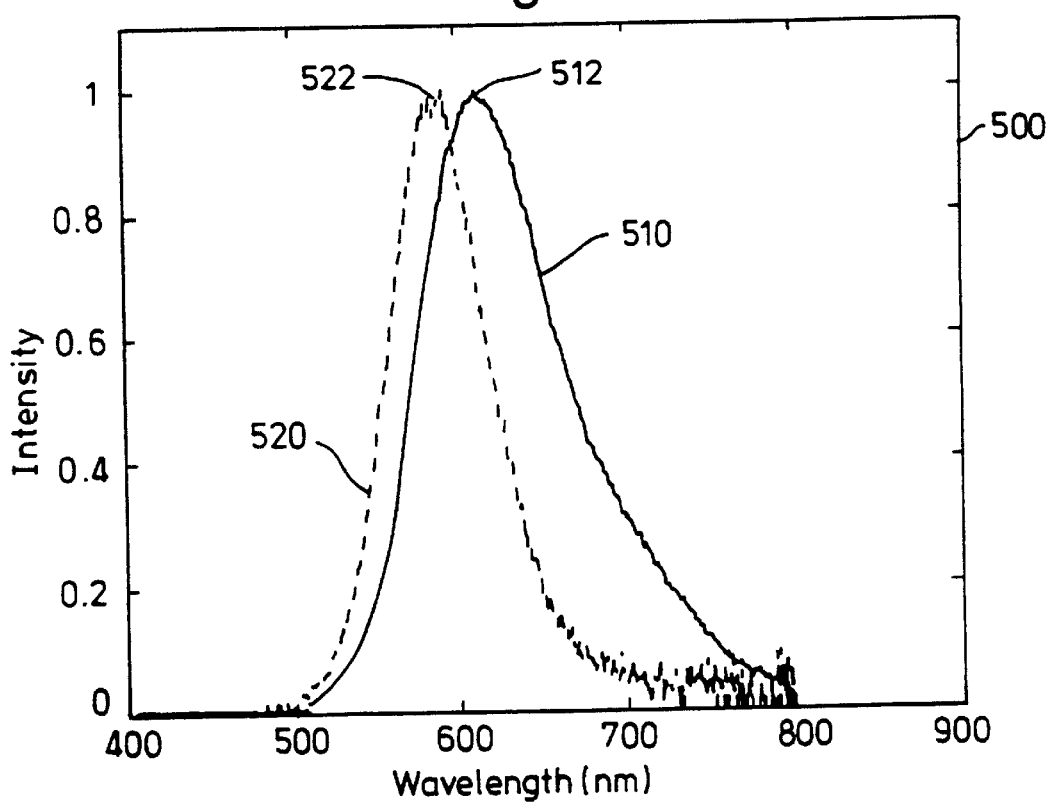
FIG. 7 graphically illustrates electroluminescence and photoluminescence measurements of the FIG. 1 device.

Referring to FIG. 7 there are shown results of electroluminescence measurements and photoluminescence measurements which have both been corrected for instrumental response. A graph 500 shows output light intensity, in arbitrary units against wavelength. The results of the photoluminescence measurements, obtained by illuminating the device 10 with blue light from the laser 430, are shown by a line 510. A photoluminescence peak in output intensity 512 was observed at a wavelength of approximately 610 nm. Typically, photoluminescence output intensity peaks are measured to be in a range 600–750 nm. When viewed by eye under ultraviolet light, the porous silicon region exhibits orange photoluminescence.

The results of the electroluminescence measurements, obtained by passing a dc electrical current through the device 10, are shown by a line 520. An electroluminescence peak in output intensity 522 was observed at a wavelength of 590 nm. The photoluminescence peak 512 thus occurs at a longer wavelength than the electroluminescence peak 522. Typically, electroluminescence output intensity peaks are measured to be in a range 520–750 nm with a full width half maximum spectral width in a range from 60 nm to 150 nm.

Figure 8:
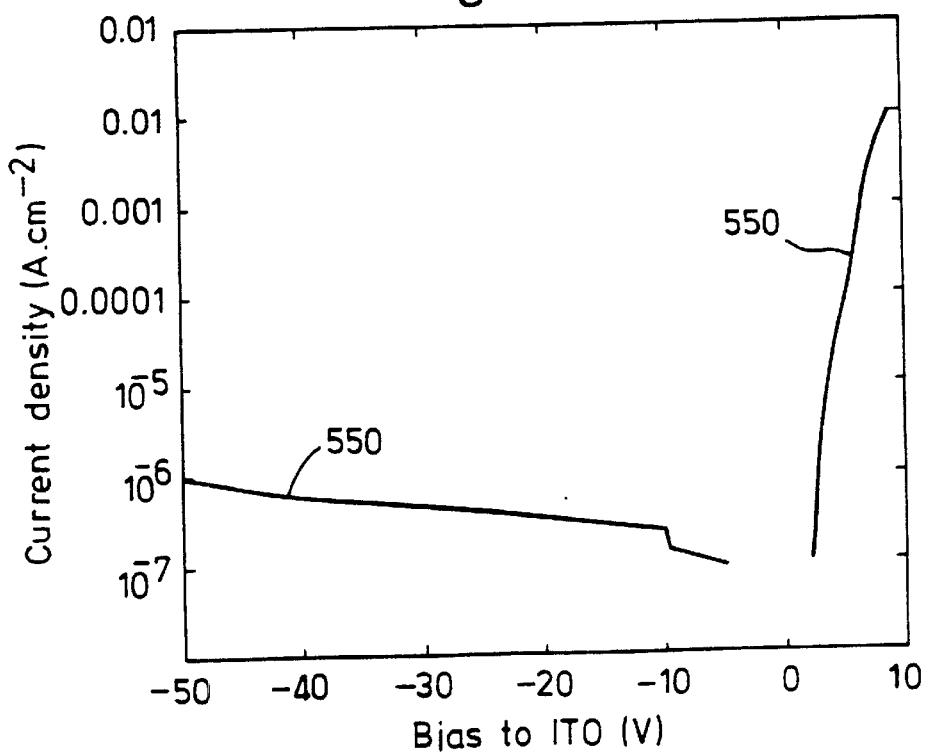
FIG. 8 shows measured electrical characteristics of the FIG. 1 device.
Figure 9:
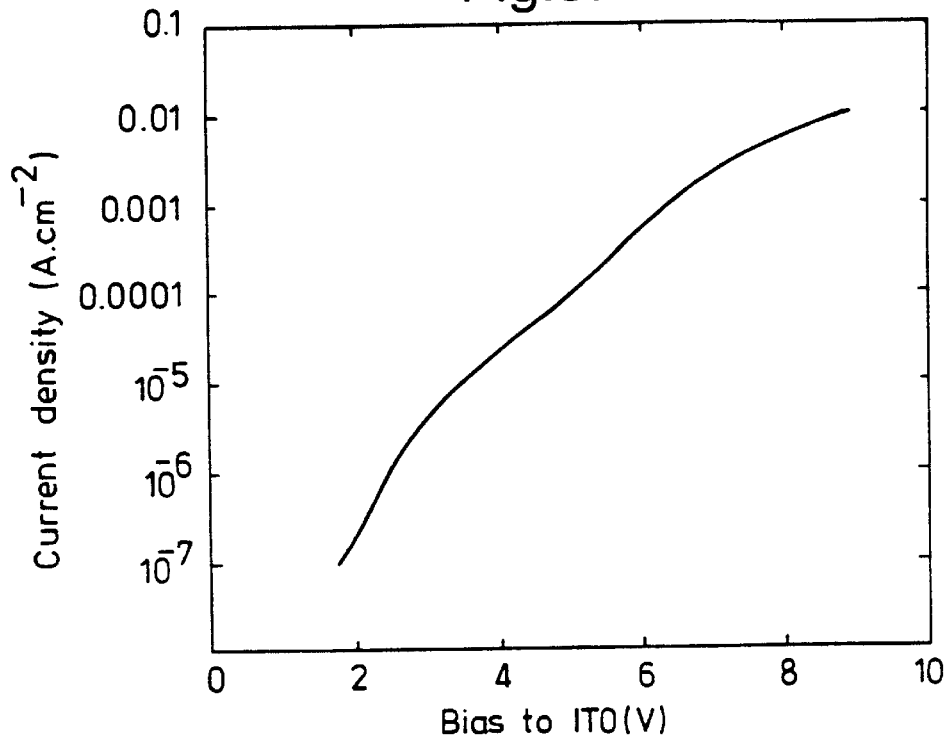
FIG. 9 shows further electrical characteristics of the FIG. 1 device.

Electrical measurements of the device 10 have shown it to be rectifying and that it is forwards biasable by the application of a positive voltage to the top electrode 24. This polarity dependence is the same as that which would be obtained from a device with a p-n junction within it, such that the p region of the p-n junction is on the porous silicon side of the wafer. Referring to FIG. 8 there is shown a log-linear plot 550 of the electrical measurements of the device 10, showing the current through the device as a function of applied voltage. In FIG. 8, the current-voltage characteristics of the device 10 are plotted as the current density in $Acm^{-2}$ against the applied voltage in volts. A positive applied voltage corresponds to a positive bias to the top electrode 24. FIG. 9 shows in greater detail the current-voltage characteristics of the device 10 when the device is positively biased. FIGS. 8 and 9 collectively demonstrate that the device 10 is rectifying with the same polarity dependence as a p-n junction.

A p-n junction diode may be characterized by an ideality factor, n, where $n \equiv (q/kT) \cdot (\partial V/\partial (\ln J))$, where J is the current density and V is the potential difference across the diode. In an ideal case, a p-n junction diode has an ideality factor of unity. For the device 10 at values of applied bias less than 0.5 V, the diode ideality factor of the device is 2. For forward biases greater than 2 V, voltage dependent ideality factors greater than 10 have been measured.

Electroluminescence from the device 10 has been detected using the measuring equipment 400 at an applied current density of 0.01 $Am^{-2}$, which from FIG. 9 corresponds to an applied voltage of approximately 2.6 volts. A threshold current density above which the device 10 luminesces might be less than this figure since the minimum measured current might be limited by the optical detection limit of the measuring equipment 400. Electroluminescence from the device 10 is visible to the unaided human eye at an applied current density above an applied current density threshold of 0.1 $Am^{-2}$. With more sensitive detection equipment, luminescence at an applied current density of 0.0001 $Am^{-2}$ has been detected with a corresponding threshold voltage of 1.7 V.

Figure 10:
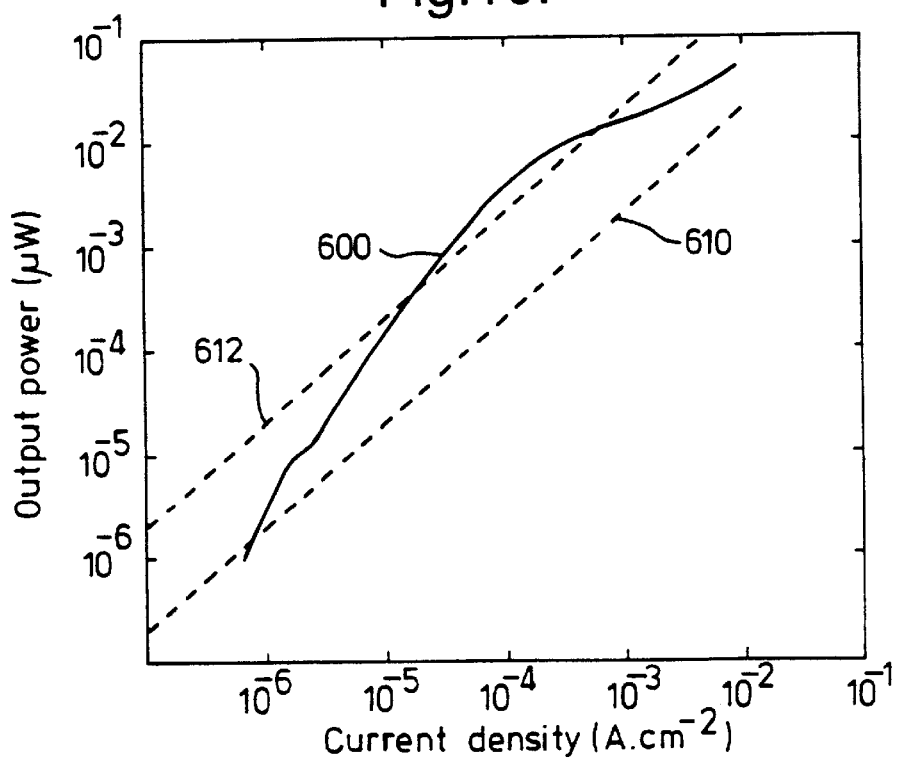
FIG. 10 shows measurements of light output from the FIG. 1 device as a function of applied current density.

Referring to FIG. 10 there is shown a plot 600 of light output power in microwatts as a function of applied current density in $Acm^{-2}$ for a device similar to the device 10, having an area of 0.01 $cm^{-2}$. Lines 610 and 612 are lines of constant external quantum efficiency. Any line parallel to the lines 610 and 612 is also a line of constant efficiency. The line 610 corresponds to an external quantum efficiency of 0.01% and the line 612 corresponds to an external quantum efficiency of 0.1%.

Figure 11:
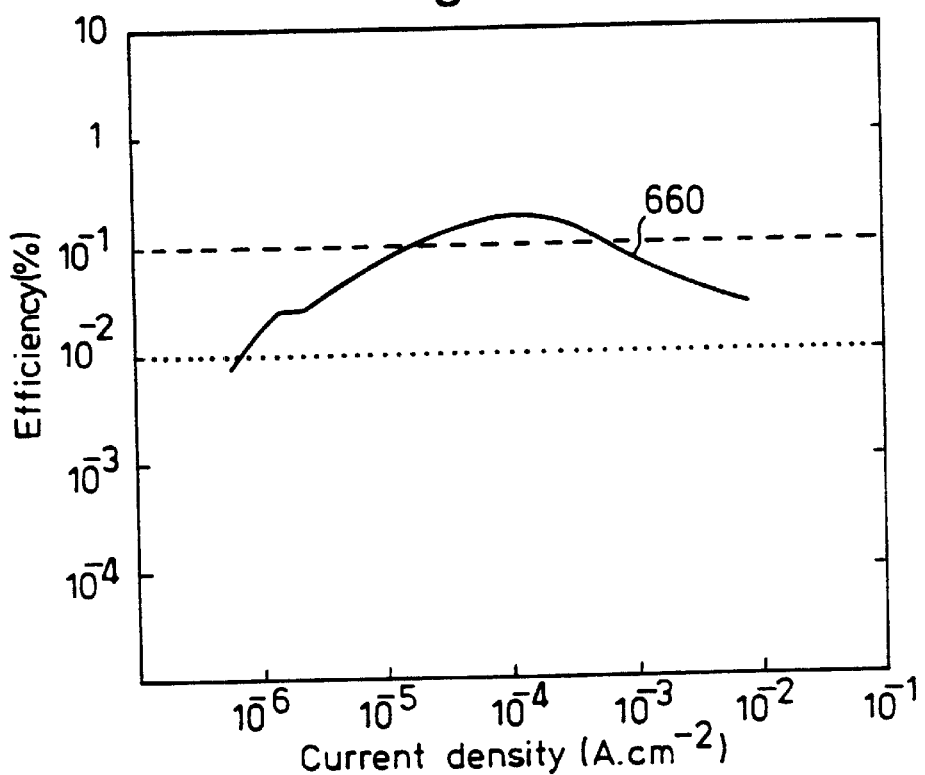
FIG. 11 shows a graph of external quantum efficiency against current density for a device of the invention.

FIG. 11 shows a plot 660 of external quantum efficiency against current density for a device similar to the device 10. The plot 660 shows that the device had an output quantum efficiency greater than 0.01% above an applied current density of 0.01 $Am^{-2}$. The measured device had an external quantum efficiency of greater than 0.1% at an applied current density in a range between 0.2 $Am^{-2}$ and 7.0 $Am^{-2}$. The device has a maximum room-temperature external quantum efficiency of 0.18% at an applied current density of 1.0 $Am^{-2}$.

Figure 12:
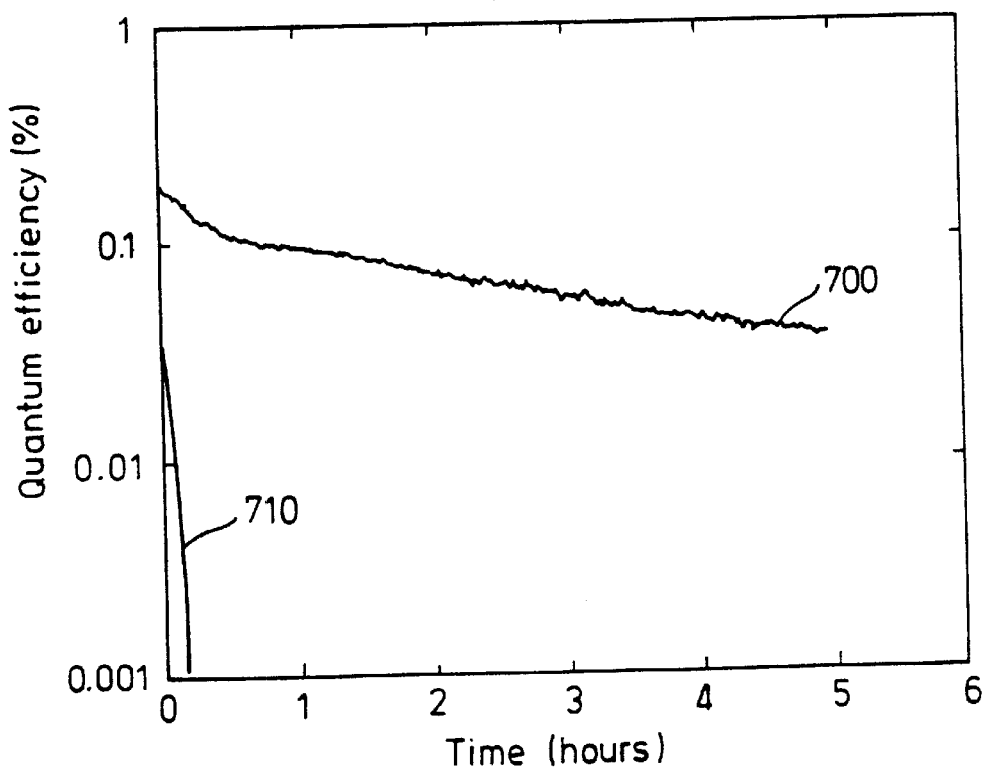
FIG. 12 illustrates output efficiency as a function of time for a device of the invention.

The above efficiency results were obtained for a device operating in a vacuum at a pressure of 0.05 mbar. Referring now to FIG. 12 there are shown measurements of the output efficiency of a device at two different vacuum pressures as a function of time. A line 700 is a plot of measurements carried put in pressure of 0.05 mbar. At 0.05 mbar, the output efficiency falls by a factor of four over a period of five hours. A line 710 is a plot of measurements carried out at a pressure of 7.3 mbar. At 7.3 mbar, the efficiency falls by a factor of 100 in a few minutes. The observed degradation in output efficiency is accompanied by an increase in the voltage required to maintain a constant current. Degradation is reduced if the device is operated in dry nitrogen compared with operation in wet air. Since the ITO contact to the device is permeable, the active region of the device may interact with the surrounding environment. It is therefore concluded that the quantum efficiency of the device 10 is degraded by exposure to water or oxygen. The combination of the device 10 and the vacuum chamber 410 form an encapsulated electroluminescent light emitting device.

For electroluminescent devices having the ITO replaced by a gold top electrode, the gold must be thin to be semitransparent. However, chemography measurements have shown that a gold thickness of greater than 1000 Å is required to stop ingress of moisture leading to degradation of the device. This thickness of gold is too great for obtaining efficient luminescence through the top contact.

Figure 13:
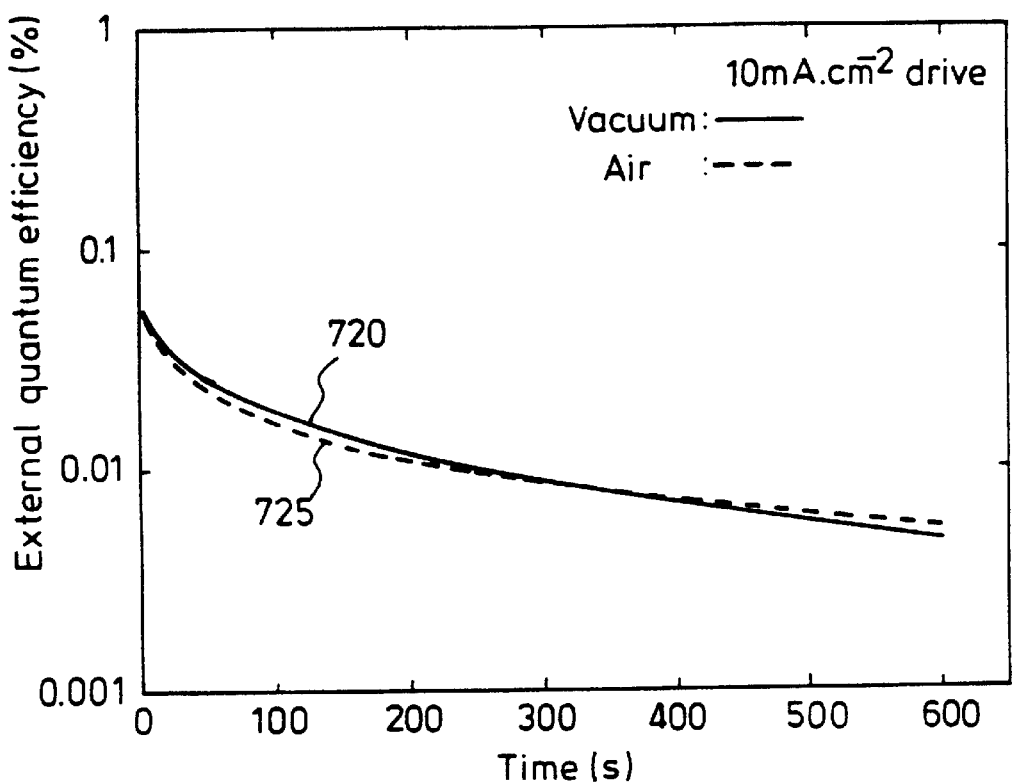
FIG. 13 illustrates output efficiency as a function of time for a device with an indium tin oxide top contact of thickness 200 nm.

Electroluminescent devices having ITO top electrodes which are thicker than 0.1 $\mu$m exhibit luminescence characteristics which differ only slightly between operation in air and operation in vacuum. FIG. 13 shows the change in efficiency with time for a device similar to the device 10 except that the top ITO electrode is 0.2 $\mu$m thick and correspondingly less permeable than the top electrode 24. A line 720 shows the change in efficiency with time for the device operating in vacuum and a line 725 shows the change for the device operating in air. FIG. 13 shows that, contrasting with FIG. 12, the degradation of a device with a thicker ITO top electrode operating in air is not significantly different from that of a similar device operating in vacuum. It should be noted that the current density applied to the device to obtain the results shown in FIG. 13 was much higher than that to obtain the results shown in FIG. 12, and hence the degradation was much more rapid.

Measurements of the external quantum efficiency of the electroluminescent devices as a function of temperature have shown a maximum external quantum efficiency of 0.4% at a temperature of 200 K (−73° C.).

Figure 14:
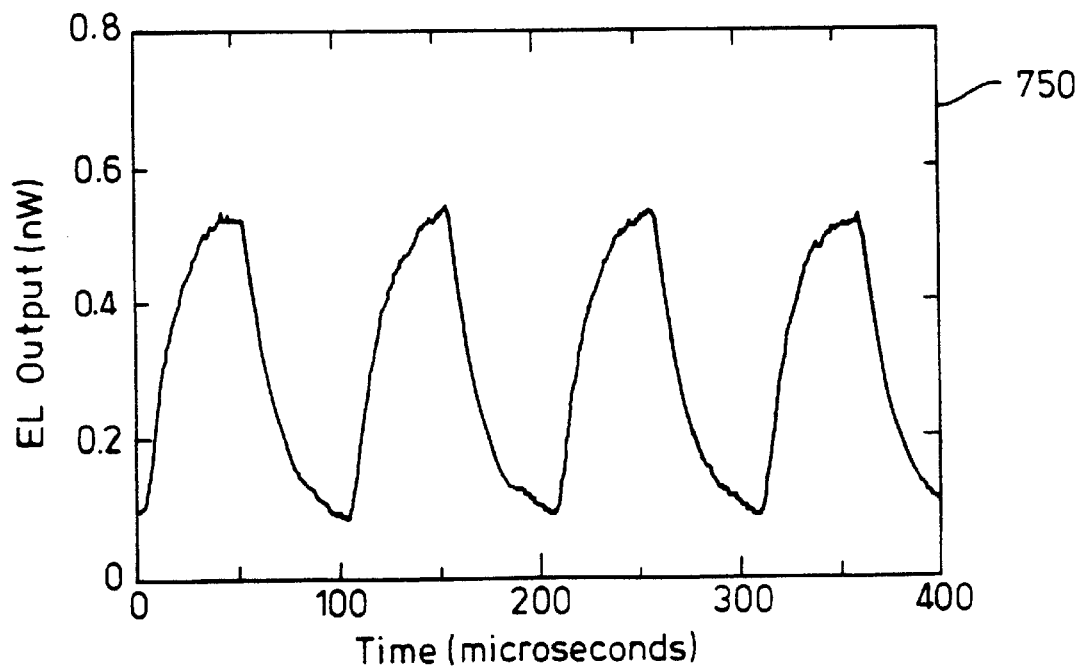
FIG. 14 shows a modulated light output from a device of the invention.
Figure 15:
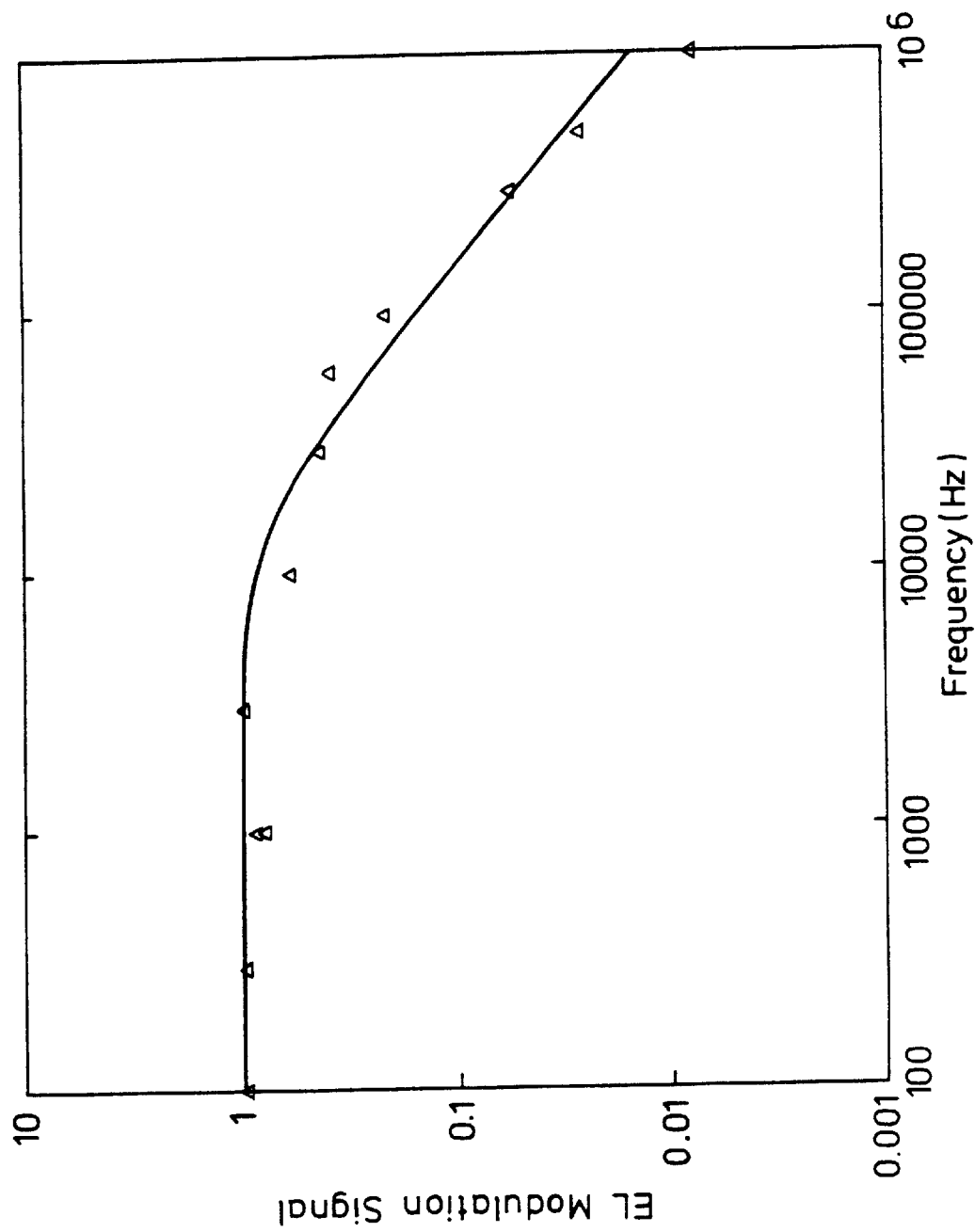
FIG. 15 shows a plot of modulation amplitude of electroluminescence as a function of drive frequency.

Referring to FIG. 14 there is shown a graph 750 of output power as a function of time for a device similar to the device 10 across which a dc bias voltage modulated by a 10 kHz square wave. FIG. 14 shows modulation of the light output of a device in response to a modulation of the applied voltage. FIG. 15 is a plot of the results of modulated output measurements at modulation frequencies of up to 1 MHz. FIG. 15 shows that a modulated output can be detected at frequencies of up to 1 MHz.

Figure 16:
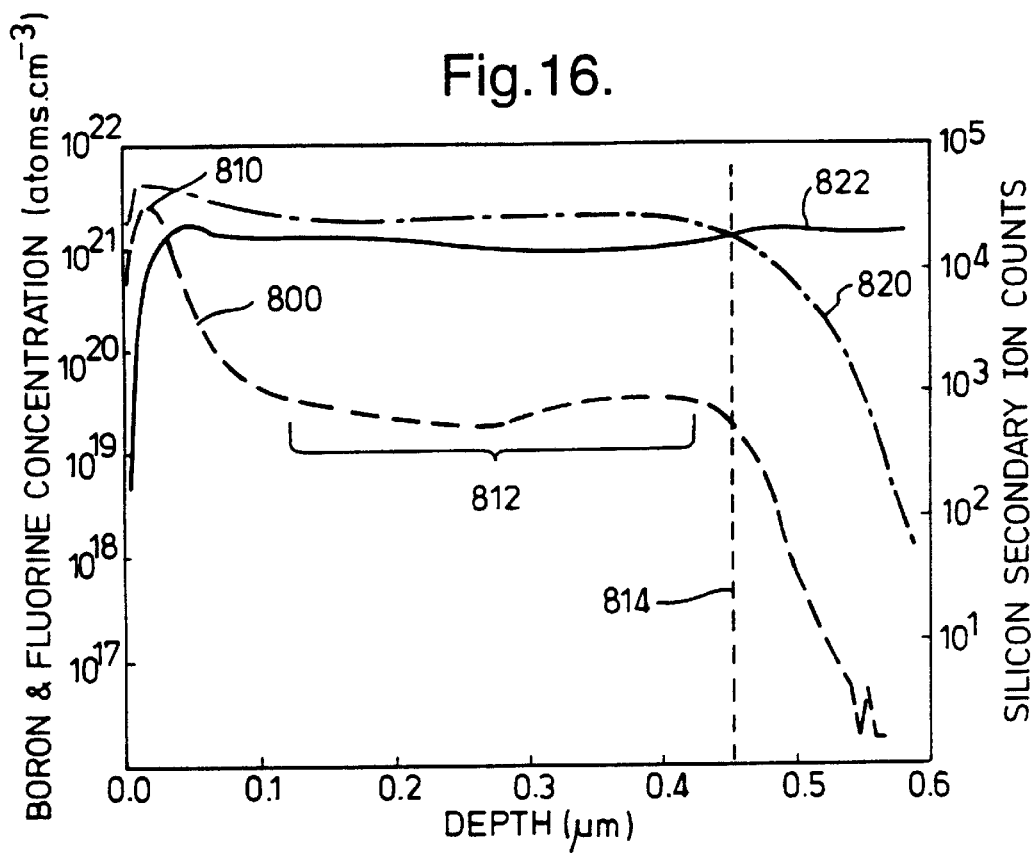
FIG. 16 shows a plot of boron dopant concentration of the FIG. 1 device after anodization.

In order to determine how the boron dopant is distributed in the device 10, SIMS has been used to measure the distribution of boron through the porous silicon region 22. FIG. 16 shows a plot 800 of boron concentration against depth for a silicon wafer after the first and second ion implantations and after the anodization and drying stages but before deposition of the top and bottom electrodes. The plot 800 shows a peak in concentration 810 close to the surface of the porous silicon and a plateau region 812 in which the boron concentration is effectively constant. The approximate position of the interface between the porous silicon and the bulk silicon is indicated by a chain line 814. FIG. 16 also shows a plot 820 of fluorine concentration and a plot 822 showing the measured silicon secondary ion counts.

Figure 17:
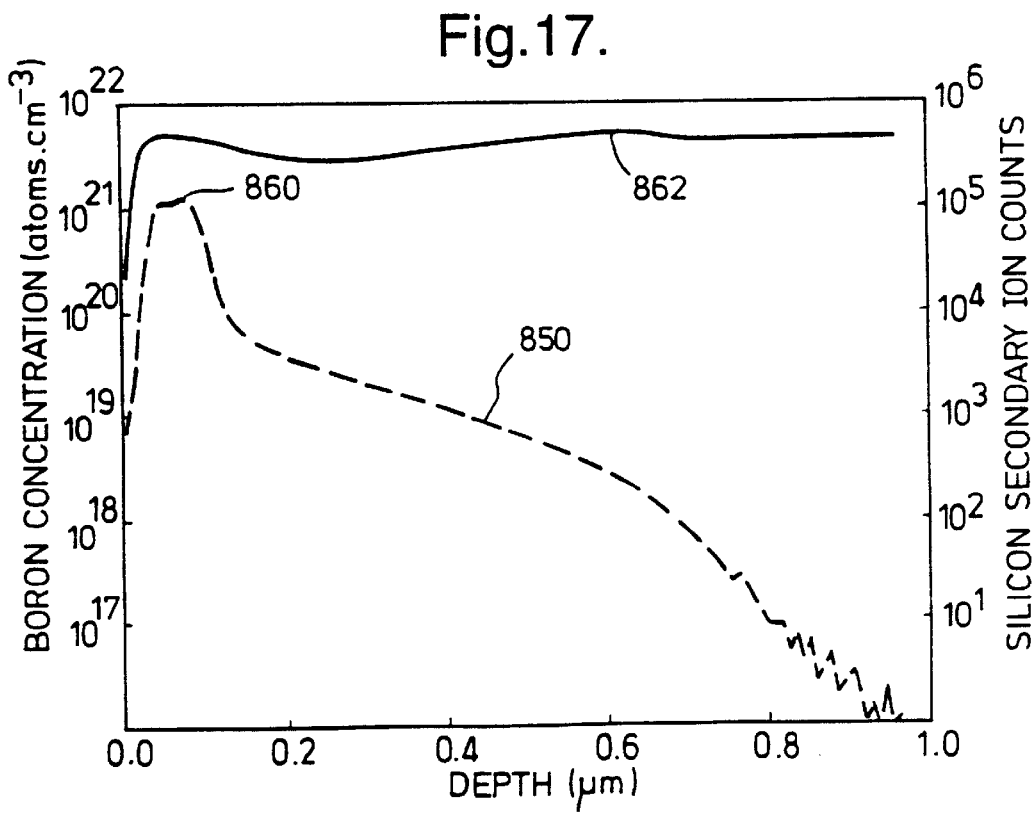
FIG. 17 shows a plot of boron dopant concentration after anodization for a device annealed between boron implantation and anodization.

As a comparison to FIG. 16, FIG. 17 shows a plot 850 of boron concentration as a function of depth for a silicon wafer after a five minute anodization which was annealed between the second ion implantation and the anodization. This anneal comprised the steps of heating the wafer in nitrogen at 525° C. for 60 minutes then heating the wafer in oxygen at 950° C. for 60 minutes followed by a dip in buffered HF to remove any oxide layer. The plot 850 shows a peak in concentration 860, similar to the plot 800, but there is no plateau region equivalent to the plateau region 812. The plot 850 shows a similar boron concentration profile as that shown by a SIMS measurement carried out on a wafer after the anneal but before anodization. FIG. 15 also shows a plot 862 of the silicon secondary ion counts. Although samples which were annealed after the second ion implantation did exhibit electroluminescence, the efficiency of this electroluminescence was lower than that for unannealed samples.

From a comparison of FIGS. 16 and 17, having regard to the disappearance of the plateau region 812, it is concluded that transportation of the boron dopant is more significant during the anodization process if the wafer is not annealed after the boron implantation prior to the anodization. The boron might be transported via the liquid anodization electrolyte or within the silicon itself.

If transportation of boron takes place during the anodization process, the following mechanism for the creation of a p-n junction within the porous silicon is envisaged. Once pores have been created in the p-type region 114, the porosity extends into the region 116. As formed, porous silicon in the region 116 is n-type in nature. As the anodization progresses and the depth of the porous silicon region increases, the n-type porous silicon is doped by boron transported from the p-type region 114 so that it becomes p-type porous silicon. In consequence, near to the advancing interface between bulk silicon and porous silicon, it is considered that there is a newly formed n-type porous silicon region and further towards the surface of the wafer the porous silicon is doped p-type by the transported boron. This would produce a p-n junction in the porous silicon region. When the anodization process is terminated, a region of n-type porous silicon would remain close to the bulk silicon—porous silicon interface and so the p-n junction in the porous silicon region would remain after the anodization process has finished. Luminescent porous silicon is only created when the anodization front extends into the region 116. Thus it is believed that a p-n junction is created within a region of luminescent porous silicon.

In order to investigate the formation mechanism for the p-n junction in the porous silicon region, experiments have been carried out to investigate the effect of changing the anodization time. Samples were anodized for different times, t, and after anodization, the samples were left in the anodizing electrolyte, with the illumination left on, for 5-t minutes after anodization to ensure that once a porous silicon region is formed it receives the same leaching effect as it does when a wafer is anodized for five minutes. In the production of the device 10, the preferred anodization time is four minutes followed by a one minute leach. After fabrication, photoluminescence and electroluminescence measurements were carried out on devices fabricated from the anodized silicon. These measurements are summarized in Table 1.

The following conclusions may be reached from the information provided by Table 1. Table 1 shows that a device fabricated from the anodized wafer becomes strongly rectifying after anodization for more than two minutes. This suggests that the feature of the device 10 responsible for the rectifying behaviour, a p-n junction, is at a depth at least equal to that corresponding to the depth of porous silicon formed after two minutes of anodization, or approximately 0.15 $\mu$m. There is also a marked change in the values of the electrical power required for detectable electroluminescence between two and three minutes anodization.

TABLE 1

| Anodization time/minutes | IV Curve Rectifying? | Electrical Power for Detectable Electroluminescence/$\mu$W | Maximum Electroluminescence External Quantum Efficiency |
|---|---|---|---|
| 1 | Weakly | 54 | $6 \times 10^{-5}$% |
| 2 | Weakly | 37 | $3 \times 10^{-3}$% |
| 3 | Strongly | 0.02 | 0.15% |
| 4 | Strongly | 0.02 | 0.18% |
| 5 | Strongly | 0.02 | 0.13% |

Electroluminescent devices have been fabricated from silicon wafers which had been subject to a boron ion-implantation different from that for the device 10. The wafer for the device 10 received a boron dose of $1\times10^{16}$ cm$^{-2}$. Devices made from a wafer which received a dose of $3\times10^{16}$ cm$^{-2}$ had an approximate maximum external quantum efficiency of 0.026%. Devices made from a wafer which received a dose of $3\times10^{15}$ cm$^{-2}$ had an approximate maximum external quantum efficiency of 0.062%. The devices made from wafers which had received boron doses which were greater than or less than the dose for fabricating the device 10 thus had significantly lower efficiencies. However since there are a large number of processing conditions which may be altered individually, changing other processing conditions in combination with a change in the boron dose may result in devices of even higher efficiency.

When ion implantation of the boron is carried out at a beam current of 25 $\mu$A rather than the standard 250 $\mu$A, with the same total dose, both electroluminescence and photoluminescence from a device have a deep red appearance to the eye rather than the usual red-orange appearance. Also, a device fabricated according to the preferred procedure which initially displayed electroluminescence which had a red-orange appearance to the eye displayed electroluminescence which was green-yellow in appearance after being stored in air for a week. These observations indicate the possibility of tuning the fabrication process to produce electroluminescent devices suitable for colour displays. Since the device 10 is fabricated from a wafer of silicon, it would be a relatively straight forward procedure to integrate the device 10 with other non-luminescent silicon devices, such as transistors, on a single piece of silicon to form an opto-electronic integrated circuit. Since the silicon is not annealed after the acceptor impurity ion implantation, it would be feasible to fabricate these other silicon devices prior to the fabrication of the electroluminescent device 10, with regions of the silicon wafer containing the non-luminescent devices being masked off by for example silicon nitride deposited by a low temperature plasma enhanced chemical vapour deposition process.

Materials other than ITO have been used for the top electrode. Gold, indium and aluminium have been used and whilst devices incorporating top electrodes of these materials do exhibit electroluminescence, the efficiencies are reduced. The bottom electrode 26 is not critical to the operation of the device 10. Electroluminescent devices in which the bottom electrode is absent have been operated with little difference in the device d.c. electrical characteristics from those of the device 10 though it is likely that the high frequency behaviour would be significantly different.

Electroluminescent devices have also been fabricated by anodizing a wafer of n silicon to form a porous silicon region and then immersing the porous silicon in a solution of boric acid. SIMS measurements confirmed that boron had been introduced into the porous silicon at high concentrations but electroluminescence efficiencies from devices made by this method were low, having external quantum efficiencies of the order 0.002%.

From the sheet resistivity measurements, it is estimated that less than 1% of the implanted boron is electrically active in the region 114 after ion implantation. The electrical measurements of the device 10 show p-n junction diode behaviour. It can therefore be concluded that the boron dopant is electrically active after the anodization process. Since there is no annealing carried out after the boron ion implantation, it is possible that the electrical activity of the boron dopant after the anodization process is due to surface doping of quantum wires in the porous silicon by transported boron. The term surface doping refers to the deposition of dopant species on the surface of the quantum wires. Since the quantum wires are less than 30 Å in width, these dopant species may remain on the surface and modify the band structure of the silicon or they may diffuse the short distance into the quantum wires.

Figure 18:
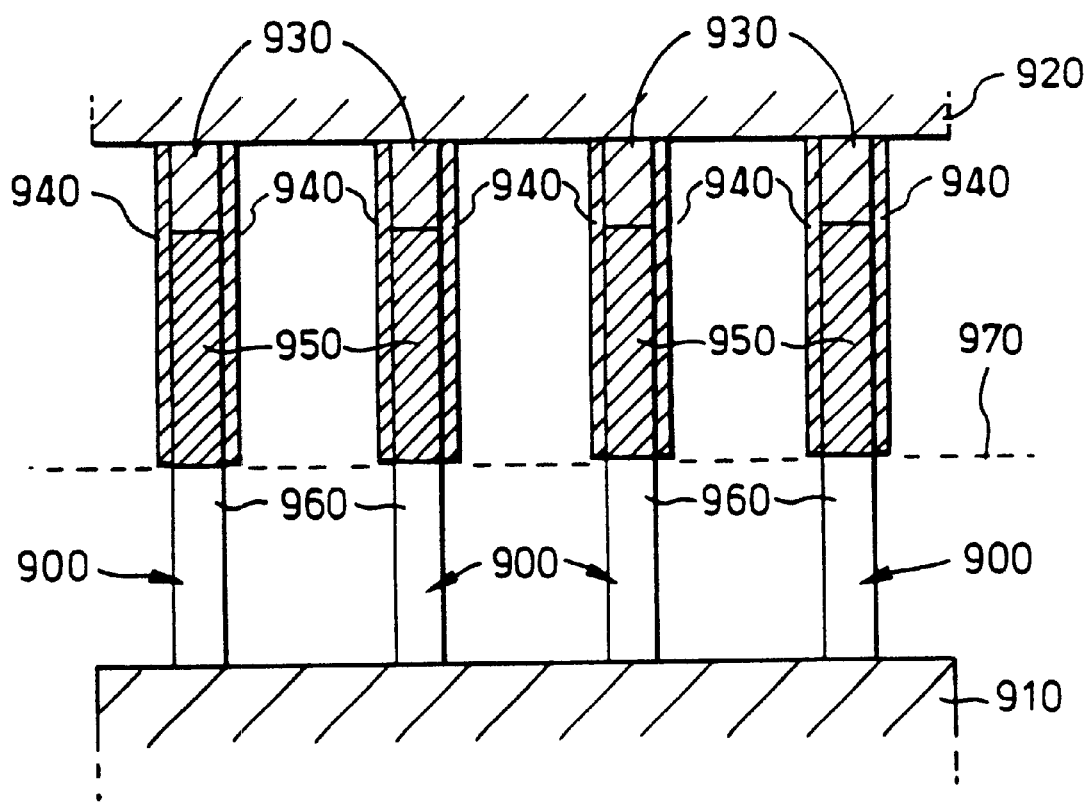
FIG. 18 shows a schematic illustration of a possible structure of the device of the invention.

The surface doping scenario is supported by the experiments involving immersion of n- porous silicon in boric acid. Referring to FIG. 18 there is shown in schematic form a possible microscopic structure of the device 10. It is emphasised that FIG. 18 is only schematic and is not to scale. FIG. 18 shows four quantum wires 900 joined to a silicon substrate 910 at one end and surmounted by a layer of ITO 920 at an opposite end. Each of the quantum wires 900 has a top region 930 which is a remnant of the second region 114 of FIG. 3. During the anodization process, it is believed that boron dopant is transported with the advancing interface between the porous silicon and the bulk silicon. Some of this boron dopant is deposited onto the surface of the quantum wires as a layer 940. A region 950, together with a region 930, of each silicon quantum wire 900 which is in close proximity to the layer 940 has p type electrical characteristics as a result of surface doping effects of the layer 940. A region 960 of each quantum wire 900 which does not have a surface layer of boron dopant remains n-type. An interface between the n-type regions of the quantum wires and the p-type regions of the quantum wires is indicated by a dashed line 970.

Transmission electron microscopy of the porous silicon region 22 after ion-milling has identified that the porous silicon comprises quantum wires of width less than 3 nm and surprisingly small pores having a diameter of approximately 7 Å. Pore widths in a range from 15 Å to 30 Å have been observed previously. It is possible that the exceedingly fine porosity could play an important, role in the performance of the device. As discussed by Canham and Groszek in Journal of Applied Physics, Volume 72, Number 4, 1992, pp 1558–1565, microporous silicon has pores of size less than 20 Å wide. Microporous silicon has been subdivided into supermicroporous silicon with a pore size of approximately 10–20 Å wide and ultramicroporous silicon with a pore size of less than approximately 10 Å wide. The pores in the freshly etched device structure are probably supermicroporous, becoming ultramicroporous upon skeleton oxidation.

It is known to be difficult to dry porous silicon structures which have a pore size less than 20 Å. SIMS measurements indicate a high level of fluorine in the porous silicon. It is therefore possible that HF trapped in the pores could protect the internal surface of the porous silicon against oxidation prior to device operation.

SIMS data indicates that a surface region of the porous silicon region 22 has significant levels of oxygen, carbon and fluorine in addition to boron. It is therefore possible that the surface region, although not strongly luminescent, has a comparable or wider band gap to an active luminescent region below it. It would therefore act as an efficient hole injection layer for the device 10. Hole injection efficiency may be quantified by a minority carrier injection ratio, g, defined as the ratio of the minority carrier current to the total current passing across the relevant junction, as described by S. M. Sze in "Physics of Semiconductor Devices", Wiley and Sons, New York, 1981, page 268. An efficient hole injection layer might have a minority carrier injection ration, g, of more than $10^{-3}$ at bias voltages below 5 volts. It is thought that an external quantum efficiency of 0.1% corresponds to an internal quantum efficiency of approximately 1%, which implies a value of g of at least $10^{-2}$.

Figure 19:
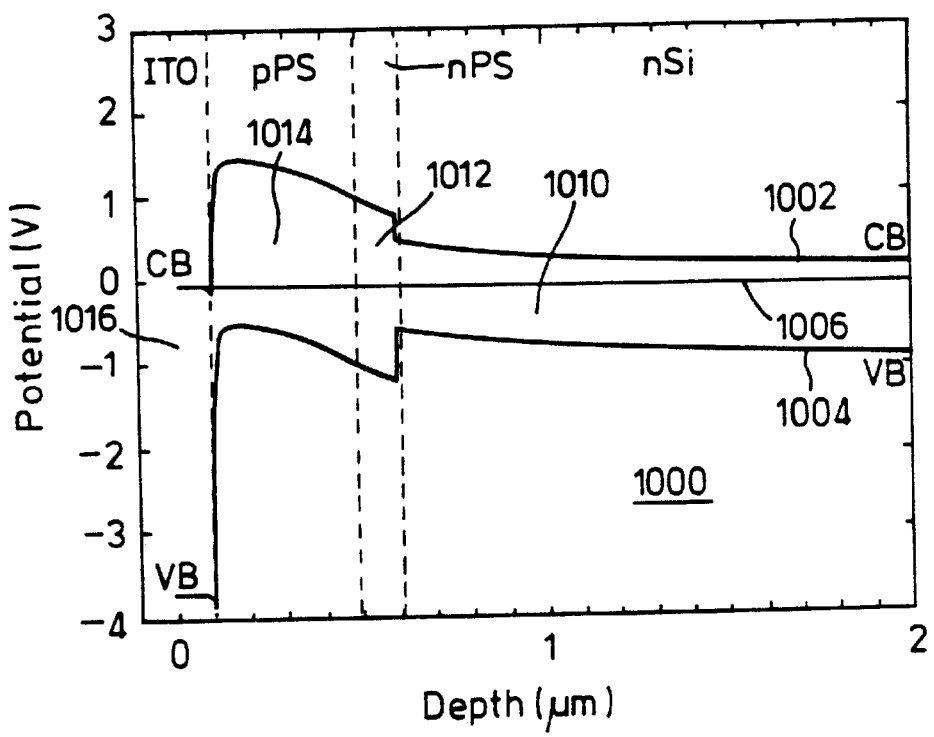
FIG. 19 shows a schematic illustration of a possible band structure of the FIG. 1 device.

Referring now to FIG. 19, there is shown a hypothetical band structure 1000 of the device 10 in an unbiased state obtained using a device simulation program. In the device simulation, the following parameters were used:

(a) a porous silicon band gap of 2 eV derived from the peak of the photoluminescence spectrum;

(b) an electron affinity of 3.86 eV, from T. Van Buuren et al., Applied Physics Letters, Volume 63, page 2911, 1993;

(c) donor and acceptor binding energies of 0.35 and 0.65 eV respectively, from T. Van Buuren et al. as above and C. Delerue et al., This Solid Films. Volume 255, page 27, 1995;

(d) dielectric constant of 3.8 for 75% void and 25% silicon, from D.A.G. Bruggeman, Ann. Phys., Volume 24, page 636, 1995; and (e) an active boron concentration profile deduced from SIMS measurements and multiplied by 0.01% to allow for most of the boron dopant not being electrically active.

A line 1002 represents the conduction band, a line 1004 represents the valence band and a line 1006 represents the Fermi level. The n-type bulk silicon has a band gap of 1.15 eV, as indicated by a region 1010 of the band structure 1000. The n-type porous silicon band structure is indicated by a region 1012 and the p-type porous silicon region band structure is indicated by a region 1014. The ITO is n-type with a band gap of 3.7 eV, as shown by a region 1016. The simulation predicts a p-n junction in the porous silicon at a depth of 400 nm from the ITO/porous silicon interface.

Figure 20:
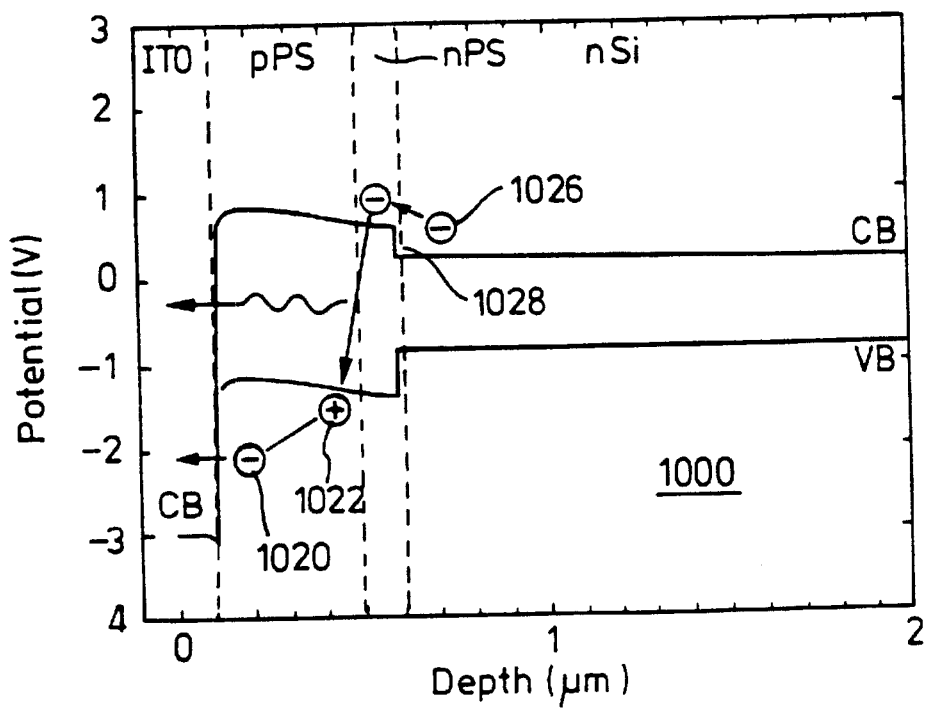
FIG. 20 shows a schematic illustration of the possible band structure after the application of a biasing voltage to the device.

FIG. 20 shows the hypothetical band structure after the application of a positive bias to the ITO relative to the bulk n-type silicon. Most of the applied potential is dropped across the p-type porous silicon. The conduction band of the ITO thus moves down relative to the valence band in the p-type porous silicon. Electrons 1020 in the valence band of the p-type porous silicon can then tunnel into unoccupied states in the conduction band of the ITO, which is equivalent to injecting holes 1022 into the valence band of the p-type porous silicon. Electrons 1026 from the conduction band of the n-type bulk silicon are transported across a barrier 1028 between the n-type bulk silicon and the n-type porous silicon into the conduction band of the n-type porous silicon. The holes in the p-type porous silicon and the electrons in the n-type porous silicon are transported towards the interface region between the p-type and the n-type porous silicon. Within this region, the electrons and holes may recombine. This recombination may either be radiative or non-radiative. An estimated 90% of photons generated by radiative recombination are absorbed within the device 10. The remainder are, emitted and result in the visible electroluminescence.

What is claimed is:

1. An electroluminescent device biasable to produce electroluminescence and comprising an electroluminescent porous silicon region and electrical connections to the porous silicon region, wherein electroluminescence from the porous silicon region is detectable when the device is biased such that a current having a current density of less than 1.0 $Am^{-2}$ flows through the device.

2. An electroluminescent device according to claim 1, characterized in that electroluminescence is detectable when the device is biased such that a current having a current density of less than 0.1 $Am^{-2}$ flows through the device.

3. An electroluminescent device according to claim 2, characterized in that electroluminescence is detectable when the device is biased such that a current having a current density of less than 0.01 $Am^{-2}$ flows through the device.

4. An electroluminescent device according to claim 3, characterized in that electroluminescence is detectable when the device is biased such that a current having a current density of less than 0.0001 $Am^{-2}$ flows through the device.

5. An electroluminescent device according to claim 1, characterized in that the device is biasable to produce electroluminescence with an external quantum efficiency greater than 0.1%.

6. An electroluminescent device according to claim 1, characterized in that the device is biasable to produce electroluminescence with an external quantum efficiency of at least 0.4%.

7. An electroluminescent device according to claim 1, characterized in that the device is operable to produce a modulated light output, modulatable at a frequency of 1 MHz.

8. A solid state electroluminescent device comprising an electroluminescent porous silicon region and electrical connections to the porous silicon region, characterized in that the device is biasable to produce electroluminescence from the porous silicon region with an external quantum efficiency greater than 0.01%.

9. An electroluminescent device according to claim 8, characterized in that the device is biasable to produce electroluminescence with an external quantum efficiency greater than 0.1%.

10. An electroluminescent device according to claim 8, characterized in that the device is biasable to produce electroluminescence with an external quantum efficiency in the range 0.01% to 0.18%.

11. An electroluminescent device according to claim 8, characterized in that the device is biasable to produce electroluminescence with an external quantum efficiency of at least 0.4%.

12. An electroluminescent device according to claim 8 wherein said porous silicon region incorporates a p-type porous silicon region and an n-type porous silicon region having a p-n junction therebetween.

13. An electroluminescent device according to claim 12, wherein the device comprises:

i) an n-type bulk silicon region, ii) an n-type porous silicon region adjacent the n-type bulk silicon region, iii) a p-type porous silicon region adjacent the n-type porous silicon region, and iv) electrical contacts to the bulk silicon region and the p-type porous region.

14. An electroluminescent device biasable to produce electroluminescence, said device comprising:

a substrate of lightly doped n-type silicon, said lightly doped silicon processed to include a porous silicon region of p-type silicon having a porosity greater than 30%; and top and bottom electrodes deposited on said p-type porous region and under said n-type silicon, wherein said lightly doped n-type substrate is first processed to include a region initially implanted with a donor impurity, secondly processed to dope said region with an acceptor impurity and then without any subsequent annealing step anodized to create the p-type porous silicon region.

15. An electroluminescent device in accordance with claim 14, wherein said bottom electrode is comprised of a film of aluminum in contact with said n-type substrate and said top electrode is comprised of a film of indium tin oxide on said p-type porous silicon region.

16. An electroluminescent device biasable to produce electroluminescence, said device comprising:

a substrate of lightly doped n-type silicon, said lightly doped silicon processed to include a porous silicon region of p-type silicon having a porosity greater than 30%; and top and bottom electrodes deposited on said p-type porous region and under said n-type silicon, wherein said lightly doped n-type substrate is first processed to include a region initially implanted with phosphorous ions at a dose of $5 \times 10^{15}$ $cm^{-2}$, secondly processed to dope said region with boron ions at a dose of $1 \times 10^{16}$ $cm^{-2}$ and then without any subsequent annealing step anodized to create the p-type porous silicon region.

17. An electroluminescent device in accordance with claim 16, wherein said bottom electrode is comprised of a film of aluminum in contact with said n-type substrate and said top electrode is comprised of a film of indium tin oxide on said p-type porous silicon region.

\* \* \* \* \*